(12) United States Patent
Huang et al.

(10) Patent No.: US 12,717,244 B2
(45) Date of Patent: Aug. 25, 2026

(54) TOOL MISMATCH REDUCTION USING ABERRATION MAP OF THE TOOLS

(71) Applicant: Taiwan Semiconductor Manufacturing Company, Ltd., Hsinchu (TW)

(72) Inventors: Shih-Chuan Huang, Hsinchu (TW); Sheng-Min Wang, Hsinchu (TW); Shih-Ming Chang, Hsinchu (TW); Ken-Hsien Hsieh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 19/252,386

(22) Filed: Jun. 27, 2025

(65) Prior Publication Data

US 2025/0321498 A1 Oct. 16, 2025

Related U.S. Application Data

(62) Division of application No. 17/843,578, filed on Jun. 17, 2022, now Pat. No. 12,416,864.

(51) Int. Cl.
*G03F 7/00* (2006.01)

(52) U.S. Cl.
CPC ...... *G03F 7/70525* (2013.01); *G03F 7/70033* (2013.01)

(58) Field of Classification Search
CPC ...................................................... G03F 7/706
See application file for complete search history.

(56) References Cited

U.S. PATENT DOCUMENTS 7,372,633 B2 5/2008 Uitterdijk et al.

FOREIGN PATENT DOCUMENTS

WO WO-2020002143 A1 * 1/2020 ......... G03F 7/70525

* cited by examiner

*Primary Examiner* — Chanceity N Robinson
(74) *Attorney, Agent, or Firm* — STUDEBAKER BRACKETT PLLC

(57) ABSTRACT

In a method of tool matching, aberration maps of two or more optical systems of two or more scanner tools are determined. A photoresist pattern is generated by projecting a first layout pattern by an optical system of each one of the two or more scanner tools on a respective substrate. One or more Zernike coefficients of the two or more optical systems are adjusted based on the determined aberration maps of the two or more optical systems to minimize critical dimension (CD) variations in a first region of the photoresist patterns on each respective substrate.

20 Claims, 15 Drawing Sheets

TOOL MISMATCH REDUCTION USING ABERRATION MAP OF THE TOOLS

CROSS-REFERENCE TO RELATED APPLICATIONS

This application is a divisional application of U.S. patent application Ser. No. 17/843,578, filed on Jun. 17, 2022, the entire content of which is incorporated herein by reference.

BACKGROUND

More than one scanner tool may be used in a production line of semiconductor devices. Therefore, it is important that each scanner tool of the production line produces the same patterns having, for example, the same critical dimension (CD) when a layout pattern is projected on a substrate. One method of producing the same CD when the layout pattern is projected by different scanner tools of the same production line, is to match each scanner tool with a golden scanner tool that has the best performance among the scanner tools. Then, the scanner tools that are matched with the golden scanner tool may produce substantially the same CD for all the layout patterns. Matching the scanner tools of a production line with a golden scanner tool needs designating a scanner tool as the golden scanner tool of the production line and keeping the scanner tool as the golden scanner tool, which might be costly. It is highly desirable to find another, less expensive, method of matching the scanner tools of the production line.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
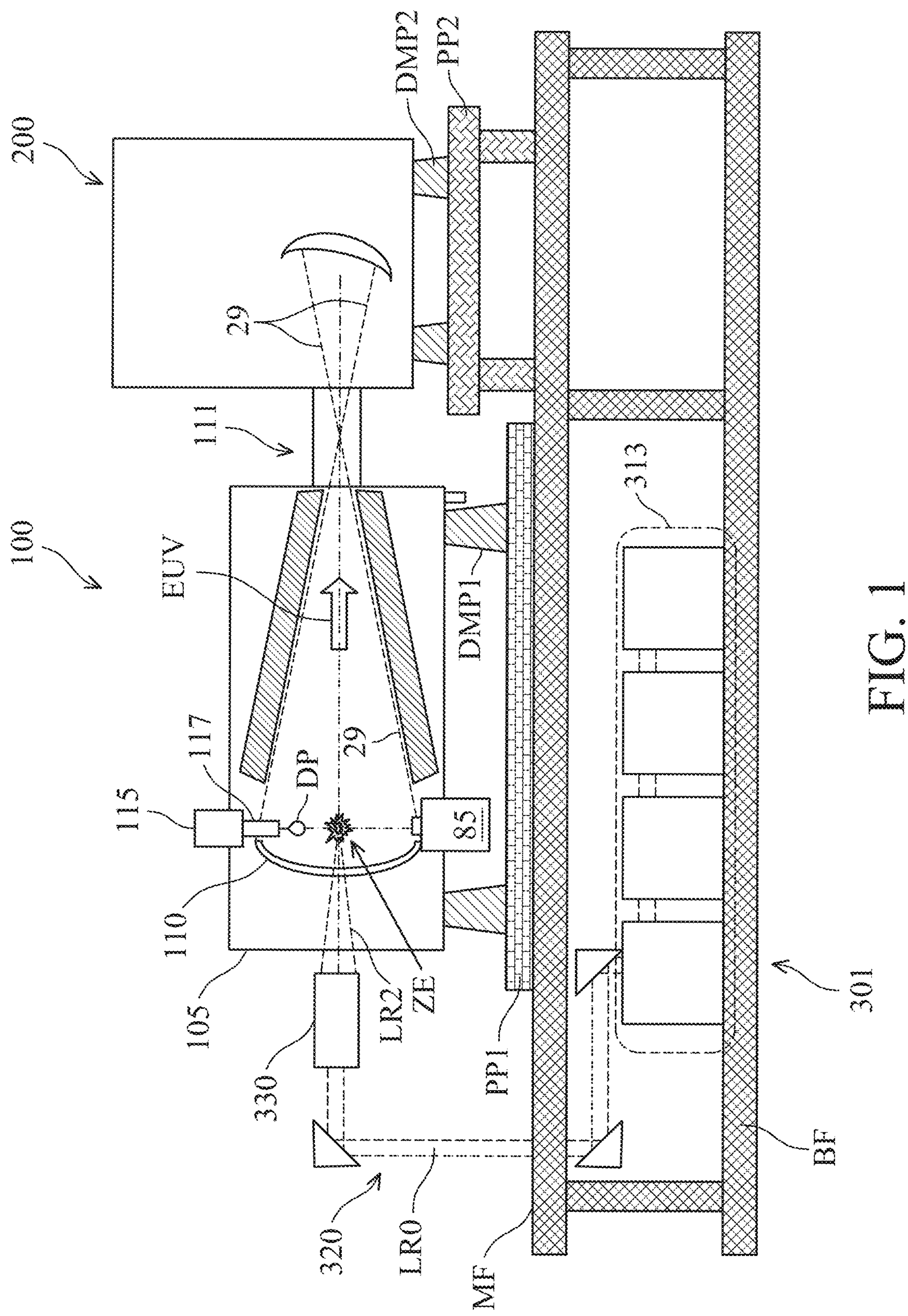
FIG. 1 shows a schematic view of an EUV lithography system with a laser produced plasma (LPP) EUV radiation source and an exposure device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, to avoid matching the scanner tools of a production line with a golden scanner tool, the scanner tools are matched with each other such that the CD variations of a same pattern generated on all of the scanner tools of the production line stay within a threshold value. In order to match the scanner tools, one or more of the Zernike coefficients are adjusted in an optimization process to adjust, e.g., improve, the aberration maps of the scanner tools. In practice, changing the Zernike coefficients is implemented by adjusting the location and/or curvature of the mirrors or lenses that are used in the exposure devices of the scanner tools.

FIG. 1 shows a schematic view of an EUV lithography system with a laser produced plasma (LPP) EUV radiation source and an exposure device. The EUV lithography system includes an EUV radiation source 100 (an EUV light source) to generate EUV radiation, an exposure device 200, such as a scanner tool, and an excitation laser source 301. As shown in FIG. 1, in some embodiments, the EUV radiation source 100 and the exposure device 200 are installed on a main floor MF of a clean room, while the excitation laser source 301 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit 111. In some embodiments, a lithography system includes the EUV radiation source 100 and the exposure device 200.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 50 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optical components, such as convex/concave/flat mirrors, a mask holding mechanism including a mask stage, and wafer holding mechanism, e.g., a substrate holding mechanism or a wafer stage. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a low-pressure environment to avoid EUV intensity loss. As noted, the exposure device 200 is maintained under a vacuum environment and the reticle is mounted over a substrate, with a photo resist layer disposed on the substrate. The EUV radiation generated by the EUV radiation source 100 is directed by the optical components to project the mask on the photo resist layer of the substrate. In some embodiments, the exposure device 200 is a scanner tool. The optical components of the exposure device 200, e.g., the scanner tool, are described in more detail with respect to FIG. 2.

In the present disclosure, the terms mask, photomask, and reticle are used interchangeably. In addition, the term resist and photoresist are used interchangeably. In some embodiments, the mask is a reflective mask. In some embodiments, the mask includes a substrate with a suitable material, such as a low thermal expansion material or fused quartz. In various examples, the material includes $TiO_2$ doped $SiO_2$, or other suitable material with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC).

The exposure device 200 includes a projection optics module for imaging the pattern of the mask on to a semiconductor substrate with a resist coated thereon secured on a substrate stage of the exposure device 200. The projection optics modules generally include reflective optics. The EUV radiation (EUV light) directed from the mask, carrying the image of the pattern defined on the mask, is collected and directed by the projection optics modules, e.g., mirrors, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes. The lithography system may further include other modules or be integrated with (or be coupled with) other modules.

As shown in FIG. 1, the EUV radiation source 100 includes a droplet generator 115 and an LPP collector mirror 110, enclosed by a chamber 105. The droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE (e.g., a target droplet location) at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 301 is a pulsed beam. The laser pulses of laser beam LR2 are generated by the excitation laser source 301. The excitation laser source 301 may include a laser generator 313, laser guide optics 320 and a focusing apparatus 330. In some embodiments, the laser generator 313 includes a carbon dioxide ($CO_2$) or a neodymium-doped yttrium aluminum garnet (Nd:YAG) laser source with a wavelength in the infrared region of the electromagnetic spectrum. For example, the laser source 301 has a wavelength of 9.4 μm or 10.6 μm in an embodiment. The laser light beam LR0 generated by the excitation laser source 301 is guided by the laser guide optics 320 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser. In some embodiments, a non-ionizing laser beam LR1 (not shown) is also generated by the excitation laser source 301 and the laser beam LR1 is also focused by the focusing apparatus 330 to pre-heat a given target droplet by generating a pre-heat laser pulse.

In some embodiments, the excitation laser beam LR2 includes the pre-heat laser pulse and a main laser pulse. In such embodiments, the pre-heat laser pulse (interchangeably referred to herein as the "pre-pulse) is used to heat (or pre-heat) the given target droplet to create a low-density target plume with multiple smaller droplets, which is subsequently heated (or reheated) by the main laser pulse from the main laser, to generate increased emission of EUV light compared to when the pre-heat laser pulse is not used.

In various embodiments, the pre-heat laser pulses have a spot size of about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation beam 29, which is collected by the collector mirror 110. The collector mirror 110, an EUV collector mirror, further reflects and focuses the EUV radiation beam 29 for the lithography exposing processes performed through the exposure device 200. A droplet DP that does not interact with the laser pulses is captured by the droplet catcher 85. As shown in FIG. 1, the EUV radiation beam 29 from the collector mirror 110 focuses at the focusing unit 111 between EUV radiation source 100 and the exposure device 200. The EUV radiation beam 29 that enters from the focusing unit 111 into the exposure device 200 is consistent with EUV radiation that is originated from the focused point, e.g., a point source, in the focusing unit 111.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as $$v_{dp} = d/(t_{rad} - t_o). \quad \text{equation (1)}$$

Because the droplet generator 115 is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, because the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized.

Figure 2:
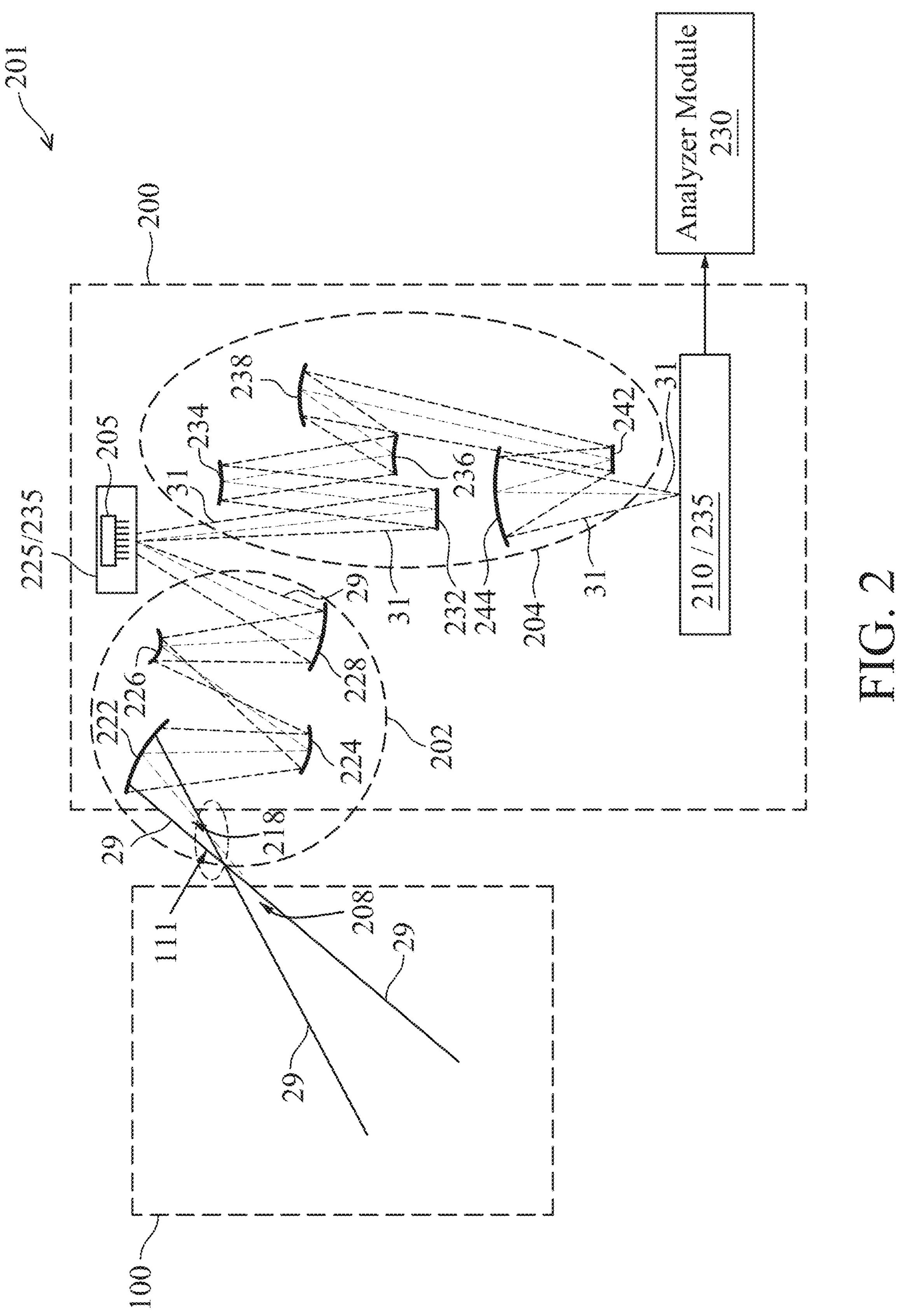
FIG. 2 shows a schematic view of an EUV lithography system with an LPP EUV radiation source, an exposure device, and a reticle mount structure.

FIG. 2 shows a schematic view of an EUV lithography system with an LPP EUV radiation source, an exposure device, and a reticle mount structure. FIG. 2 shows a schematic view 201 of an EUV lithography system with a LPP EUV radiation source 100, an exposure device 200, and a reticle mount structure 225 showing a reticle 205, e.g., a photo mask. The EUV radiation source 100 produces the EUV radiation beam 29 as described above with respect to FIG. 1. The EUV radiation beam 29 passes through the focusing unit 111 outside EUV radiation source 100 after exiting the EUV radiation source 100 through an aperture 208 of the EUV radiation source 100. In some embodiments, the aperture 208 is made of a material transparent to EUV radiation.

The EUV lithography system of FIG. 2 also includes the exposure device 200. The exposure device includes a plurality of convex, concave, or flat mirrors. As shown, the EUV radiation beam 29 is focused by the focusing unit 111 between the EUV radiation source 100 and the exposure device 200 and then enters the exposure device 200 through an aperture 218 of the exposure device 200 and the aperture 218 is made of a material transparent to EUV radiation in some embodiments. After entering the exposure device 200, the EUV radiation beam 29 is directed by illumination optics 202 to the reticle 205. As shown, the EUV radiation beam 29 is directed to a mirror 222, e.g., a converging mirror, of the illumination optics 202 and reflects from the mirror 222, is directed to a mirror 224, e.g., another converging mirror, of the illumination optics 202 and reflects from the mirror 224, is directed to a mirror 226, e.g., a diverging mirror, of the illumination optics 202 and reflects from the mirror 226, and is directed a mirror 228, e.g., a flat mirror, of the illumination optics 202 and reflects from the mirror 228 to impinge on the reticle 205, e.g., a reflective photo mask. The EUV radiation beam 31 is reflected from the layout patterns of the reticle 205.

As shown in FIG. 2, after reflecting from the layout patterns of the reticle 205, the EUV radiation beam 31 is directed by projection optics 204 to the wafer 210 (a substrate with a photo resist layer on the substrate) or alternatively is directed to an image detector 235. As shown, the EUV radiation beam 31 is directed to a mirror 232 (M1), e.g., a flat mirror, of the projection optics 204 and reflects from the mirror 232, is directed to a mirror 234 (M2), e.g., a diverging mirror, of the projection optics 204 and reflects from the mirror 234, is directed to a mirror 236 (M3), e.g., another diverging mirror, of the projection optics 204 and reflects from the mirror 236, is directed to a mirror 238 (M4), e.g., a converging mirror, of the projection optics 204 and reflects from the mirror 238, is directed to a mirror 242 (M5), e.g., another diverging mirror, of the projection optics 204 and reflects from the mirror 242, is directed to a mirror 244 (M6), e.g., another converging mirror, of the projection optics 204 and reflects from the mirror 244 to impinge on the wafer 210 or to imping on the image detector 235. In some embodiments, one or more of the mirrors 232, 234, 236, 238, or 242 are controllable, e.g., the location and/or the curvature of the mirrors are altered to change a wavefront reflected from the mirrors as described below with respect to FIG. 5A, 5B, or 5C. Also, as shown, the image detector 235 is connected to an analyzer module 230 that receives an image captured by the image detector 235. In some embodiments, as described below, the analyzer module 230 performs an analysis of the captured image and detects interference fringe patterns. In some embodiments, the projection optics 204 and/or the illumination optics 202 are referred to as an optical system of the exposure device 200, e.g., the scanner tool. In some embodiments, the EUV radiation source 100 is included in the optical system. In some embodiments, the image detector 235 is included in the optical system.

Figure 3B:
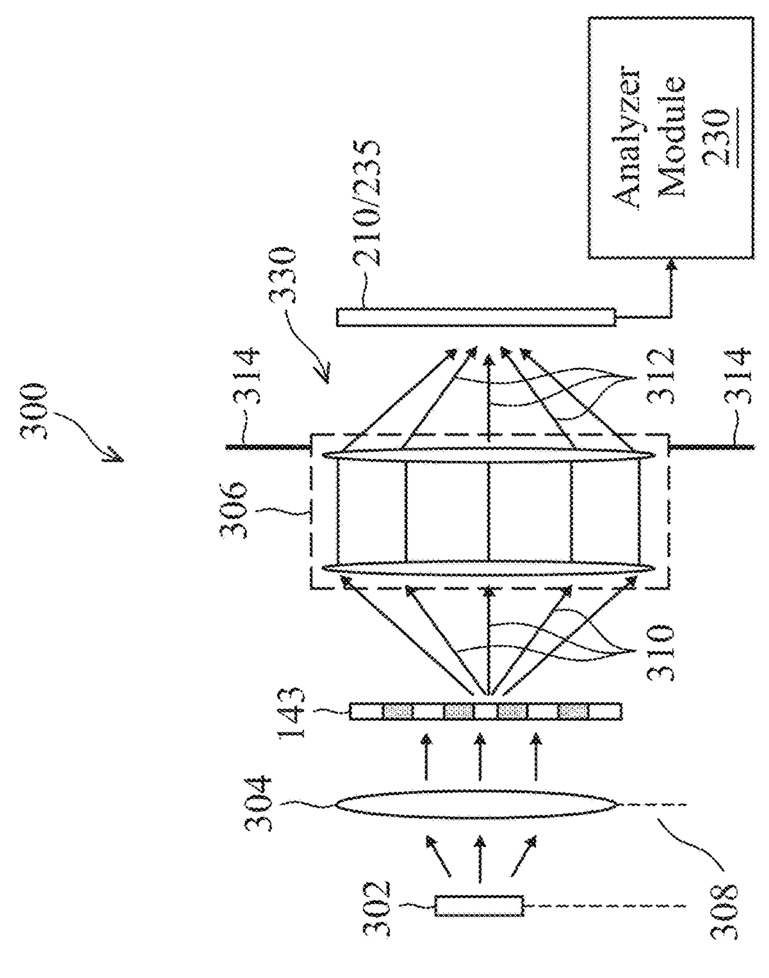
FIGS. 3A, 3B, 3C, and 3D show exposure devices and portions of an exposure device.
Figure 3A:
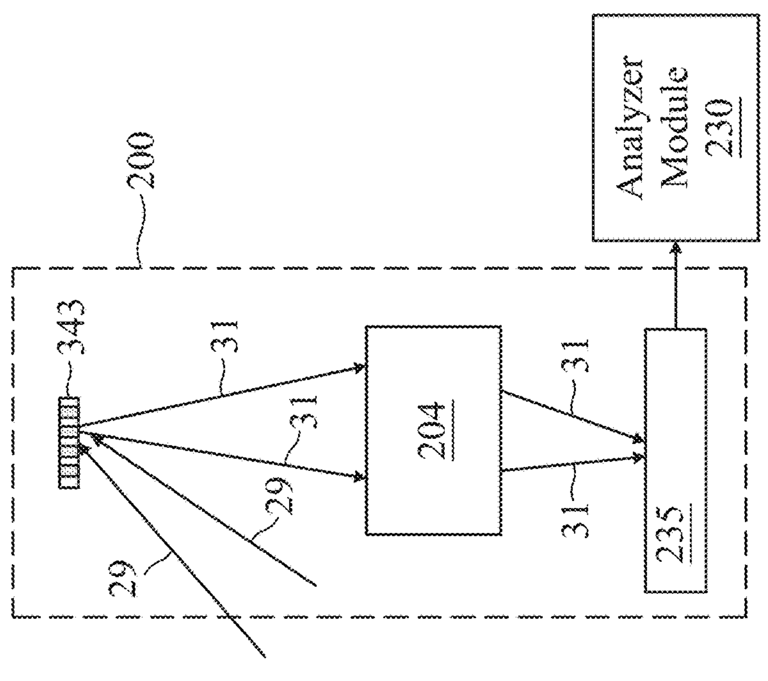

FIGS. 3A, 3B, 3C, and 3D show exposure devices and portions of an exposure device. FIG. 3A shows the exposure device 200 and shows the EUV radiation beam 29 that is directed by the illumination optics 202 of FIG. 2 to a reflective grating pattern 343. As shown, instead of the reticle 205, the exposure device 200, e.g., the scanner tool, has the reflective grating pattern 343. The EUV radiation beam 29 impinges on the reflective grating pattern 343 and is imaged by the projection optics 204 onto the image detector 235 and the image captured by the image detector 235 is analyzed by the analyzer module 230. In some embodiments, the image captured by the image detector 235 shows aberration of the projection optics 204. Thus, based on the resolution and orientation of the reflective grating pattern 343, the analyzer module 230 determines a Zernike expansion coefficient of the aberration of the projection optics 204, e.g., a coefficient when the aberration is projected onto the space of Zernike polynomials. In some embodiments, multiple gratings with different resolutions and different orientations are used as the reflective grating pattern 343 and, thus, multiple Zernike expansion coefficients of the aberration map of the projection optics 204 are determined. Thus, in some embodiments, by using multiple reflective gratings with multiple resolutions and multiple orientations, the aberration of the projection optics 204 can be approximated using the determined Zernike expansion coefficients.

FIG. 3B shows an optical system 300 that is used in a transmissive lithographic system in some embodiments. The optical system 300 shows an illumination source 302 at a distance 308 from a lens 304. The lens 304 transmits a radiation beam of the light source through the pattern 143. The transmitted radiation beam 310 converges using an objective lens system 306 to generate the convergent beam 312 and to create a projected photoresist pattern of the pattern 143 on the substrate 210 or on the image detector 235. In some embodiments, illumination source 302 produces deep ultraviolet (DUV) radiation in the range of 100 nm to 290 nm and, thus, the radiation beam 310 is a DUV radiation beam. As shown, blades 314 block any radiation that is outside an exit pupil 331 of the optical system 300. In some embodiments, the pattern 143 is consistent with the layout patterns of the reticle 205 and, thus, the layout patterns of the reticle 205 are projected on the photoresist coated substrate 210 and after developing produces photoresist patterns on the substrate 210. In some embodiments, the pattern 143 is a grating that is used to determine a Zernike expansion coefficient of the aberration map of the scanner tool. Thus, the pattern 143 may be replaced with multiple other gratings having multiple resolutions and multiple orientations to determine other Zernike expansion coefficients of the aberration map of the scanner tool, e.g., the optical system 300 of the scanner tool, based on the images captured by the image detector 235 and then analyzed by the analyzer module 230.

Figure 3D:
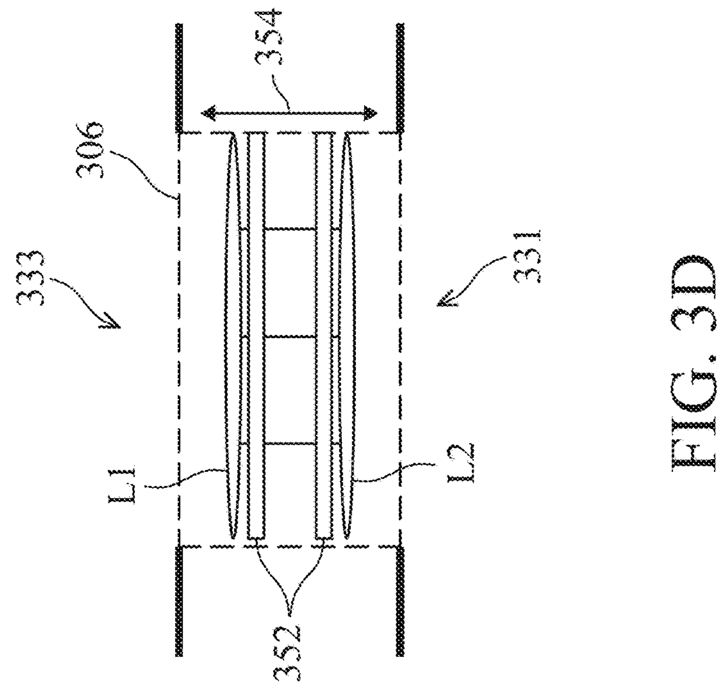
Figure 3C:
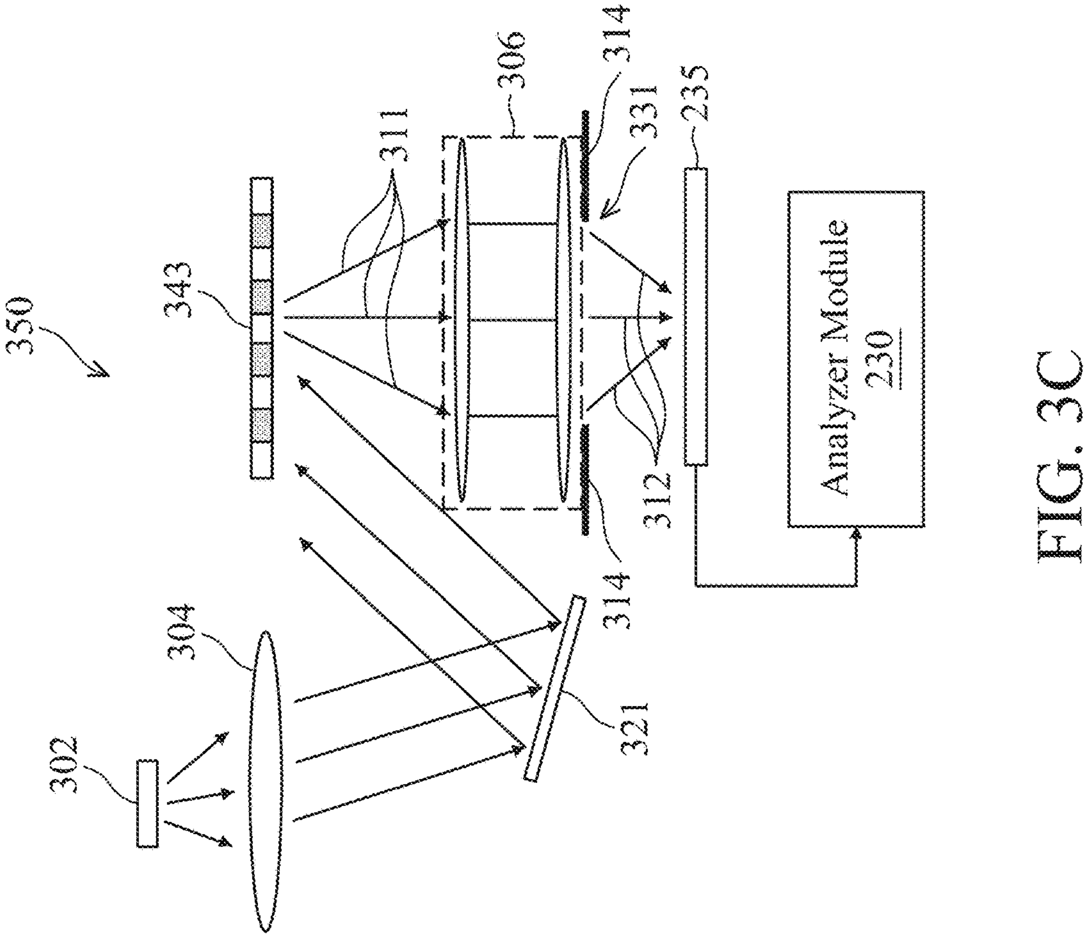

FIG. 3C shows an optical system 350 that is used in a lithographic system in some embodiments. The optical system 350 shows the illumination source 302. The lens 304 transmits a radiation beam of the illumination source 302. The radiation beam is reflected by a mirror 321 and is directed towards a reflective pattern 343, and produces the reflected radiation beam 311 that is reflected off the reflective pattern 343. The reflected radiation beam 311 converges using the objective lens system 306 to generate a convergent beam 312 and to create a projected pattern of the reflective pattern 343 on the substrate 210 or on the image detector 235. FIG. 3C also shows the exit pupil 331 of the optical system 350. In some embodiments, the illumination source 302, e.g., the light source or the input source, is a deep ultraviolet (DUV) light source with a wavelength of about 100 nm to about 290 nm, or the light source is an extreme ultraviolet (EUV) source with a wavelength of about 10 nm to about 100 nm. In some embodiments, the pattern 343 is a reflective grating, and different reflective gratings with multiple resolutions and multiple orientations are used to determine the Zernike expansion coefficients of the aberration of the optical system 350 based on the images captured by the image detector 235 and then analyzed by the analyzer module 230.

FIG. 3D shows the objective lens system 306 having an entrance pupil 333 and the exit pupil 331. The objective lens system 306 may include two or more lenses L1 and L2 for directing the reflected radiation beam 311 or the transmitted radiation beam 310 onto the substrate 210, e.g., a wafer, or onto the image detector 235. In some embodiments, the objective lens system 306 includes one or more Zernike plates 352 that may be moved along a length 354 inside the objective lens system 306 to be placed before the lenses, between the lenses, or after the lenses. In some embodiments, two or more Zernike plates 352 are used to compensate, e.g., correct, the aberration of the optical system 350 or correct the aberration of the optical system 300.

Figure 4B:
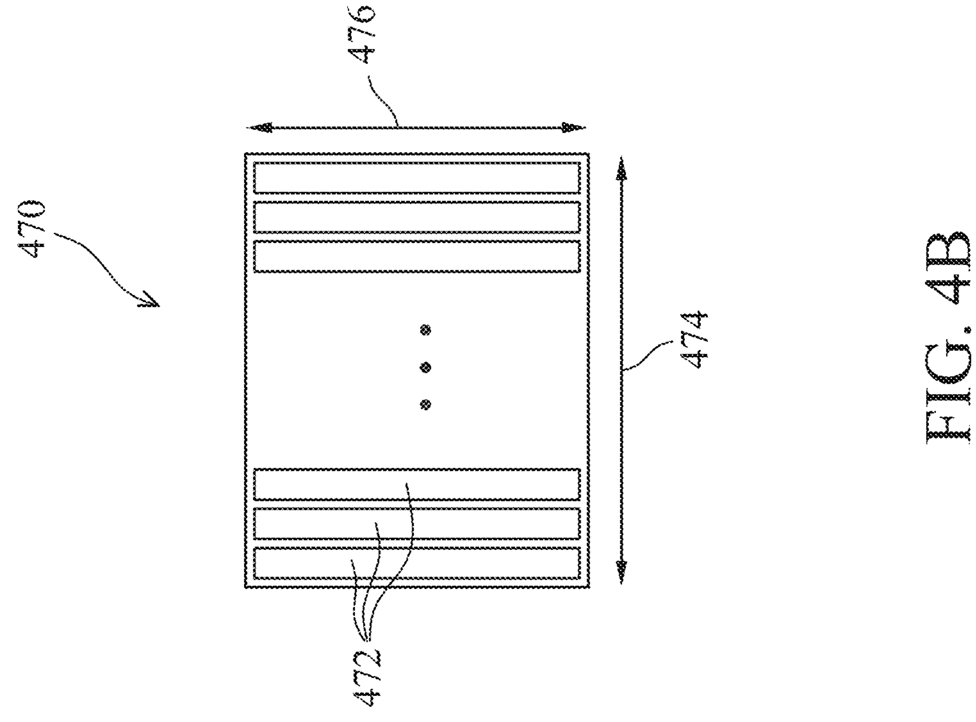
FIGS. 4A and 4B show multiple dies on a substrate and multiple slits of a die on the substrate that a layout pattern is projected on the dies by the mirrors in accordance with some embodiments of the present disclosure.
Figure 4A:
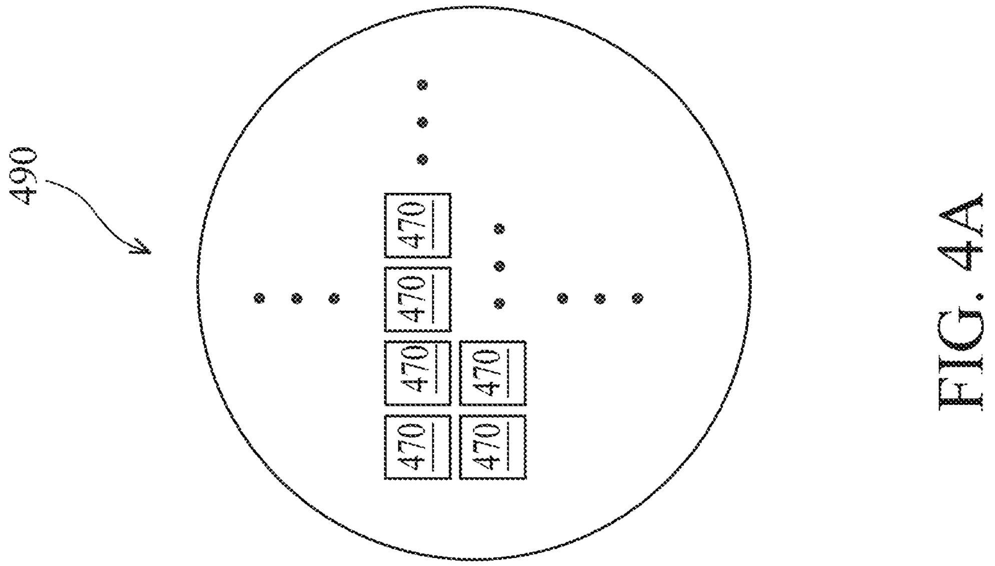

FIGS. 4A and 4B show multiple dies on a wafer and multiple slits of a die that a layout pattern is projected to by the mirrors in accordance with some embodiments of the present disclosure. FIG. 4A shows a wafer 490, e.g., a substrate, which is consistent with the substrate 210 of FIG. 2 that includes two or more dies 470. As described, the mirror 400 is used as part of the mirrors of the illumination optics 202 and/or as part of the mirrors of the projection optics 204 for projecting the layout patterns of the reticle 205 onto one or more dies 470 of the wafer 490. FIG. 4B shows the die 470 of the wafer 490. As shown, the die 470 has a length 476 and a width 474. In some embodiments, length 476 or the width 474 of the die 470 is between about 4 mm and 30 mm. In some embodiments, the width 474 of the die 470 is divided into two or more slits 472 or between 10 and 20 slits 472. In some embodiments, the aberration of optical system 300 or 350 is separately determined in each slit 472 of the die 470 and the Zernike coefficients, e.g., Zernike expansion coefficients, of the slits 472 are determined.

Figures 5A, 5B:
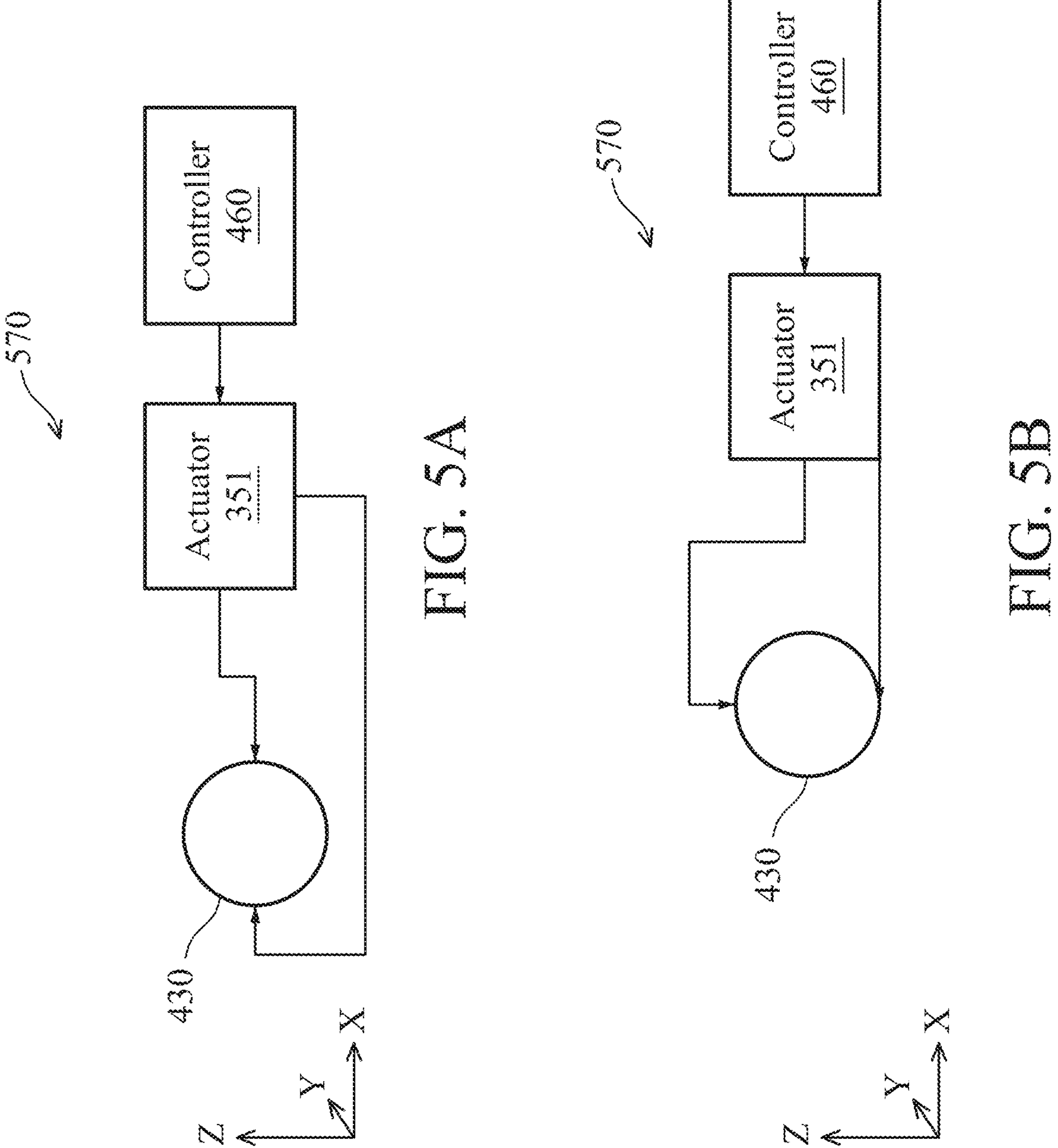
FIGS. 5A, 5B, 5C, and 5D show one or more mirrors and a controller of the mirrors in accordance with some embodiments of the present disclosure.
Figures 5C, 5D:
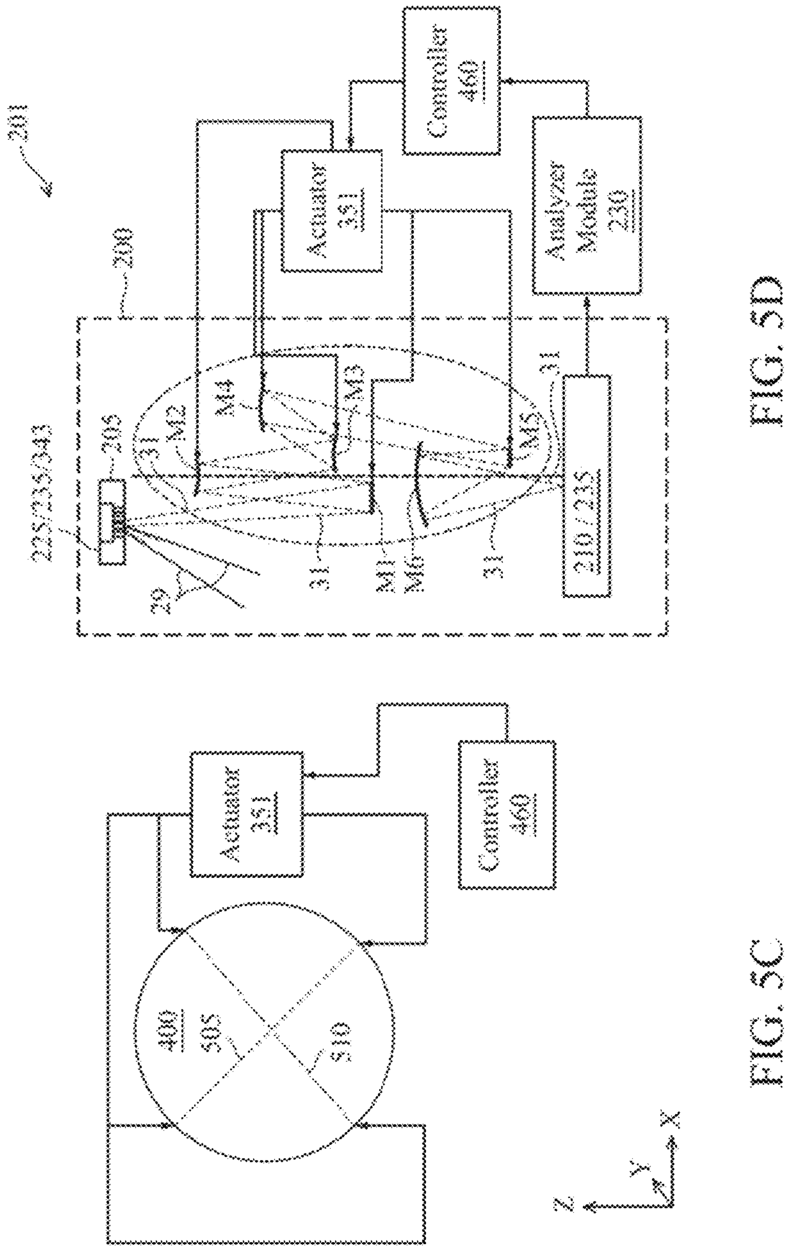

FIGS. 5A, 5B, 5C, and 5D show one or more mirrors and a controller of the mirrors in accordance with some embodiments of the present disclosure. As shown in FIGS. 5A, 5B, and 5C, the mirror 430 or 400 is part of the illumination optics 202 or the projection optics 204. In some embodiments, as shown in a mirror control system 570 of FIG. 5A, the mirror 430 is coupled to the actuator 351 that includes, for example, one or more motors or piezo electric devices to move the mirror 430 along the X, Y and/or Z directions by a controller 460. In some embodiments, the Y-direction is normal to the surface of the mirror (parallel with the optical axis). In some embodiments, the controller 460 is coupled to the actuator 351 to control the movement of the mirror 430 or 400 up and down in the Z-direction, laterally in the X-direction, and back and forth in the Y-direction. In some embodiments, the mirror 430 or 400 is moved within ±about 20 mm along the X, Y, or Z-direction. In some embodiments, a tilt angle of the mirror 430 or 400 is also controlled to change a direction of the wavefront reflected from the mirror 430 or 400 and change a phase of the wavefront reflected from the mirror 430 or 400. Thus, in some embodiments, the controller 460 adjusts a direction and phase of the EUV radiation beam 29 or 31 exiting the illumination optics 202 or exiting the projection optics 204 by moving and/or tilting the mirror 430 or 400.

As shown in FIG. 5A, 5B, or 5C, the controller 460 exerts force through the actuator 351 to at least two locations, at two ends of a diameter, on a perimeter of each mirror 430 or 400 to adjust, e.g., increase or reduce, a curvature of the mirror 430 or 400, e.g., perpendicular to Y-direction. As described above, the mirrors may be incorporated into the mirrors 222, 224, 226, or 228 of the illumination optics 202, or into the mirrors 232, 234, 236, 238, or 242 of the projection optics 204. Thus, controlling the curvature and/or location of the mirror 430 or 400 of the above mirrors may adjust two or more Zernike coefficients and may reduce the aberration of the projection optics 204 or the illumination optics 202. As shown in FIGS. 5A and 5B, the pressure is exerted at least at the two ends of the diameter along the Z-direction or X-direction respectively. As shown in FIG. 5C, the pressure is exerted at least at two ends of the diameters 505 and 510 having 45 degrees and 135 degrees with the X-direction.

FIG. 5C shows the mirror 400 that is coupled via the actuator 351 to the controller 460 and the controller 460 adjusts a phase and/or direction of the wavefront reflected from the mirror 400. Thus, may adjust the Zernike coefficients corresponding with the aberration of the illumination optics 202 and/or the projection optics 204 if the mirror 400 is used as one of the mirrors of the illumination optics 202 and/or the projection optics 204.

FIG. 5D shows the exposure device 200 that includes the mirrors M1, M2, M3, M4, M5, and M6 that are consistent with the mirrors 232, 234, 236, 238, 242, and 244 of the projection optics 204 of FIG. 2. One or more of the mirrors M1, M2, M3, M4, or M5 are the mirrors 430 or 400 that are coupled through the actuator 351 to the controller 460. As discussed, the analyzer module 230 receives the aberration map of the projection optics 204 from the image detector 235. The controller 460 determines how to adjust the Zernike coefficients corresponding with the aberration map of the projection optics 204. Then, the controller 460 commands the actuator 351 to adjust the one or more of the mirrors M1, M2, M3, M4, or M5 to adjust the Zernike coefficients corresponding with the aberration map of the projection optics 204 to improve the CD uniformity of the pattern produced by projecting the layout patterns of the reticle 205 on the substrate 210. The controller 460 adjusts the curvature and/or location of one or more of the mirrors M1, M2, M3, M4, or M5.

Figure 6B:
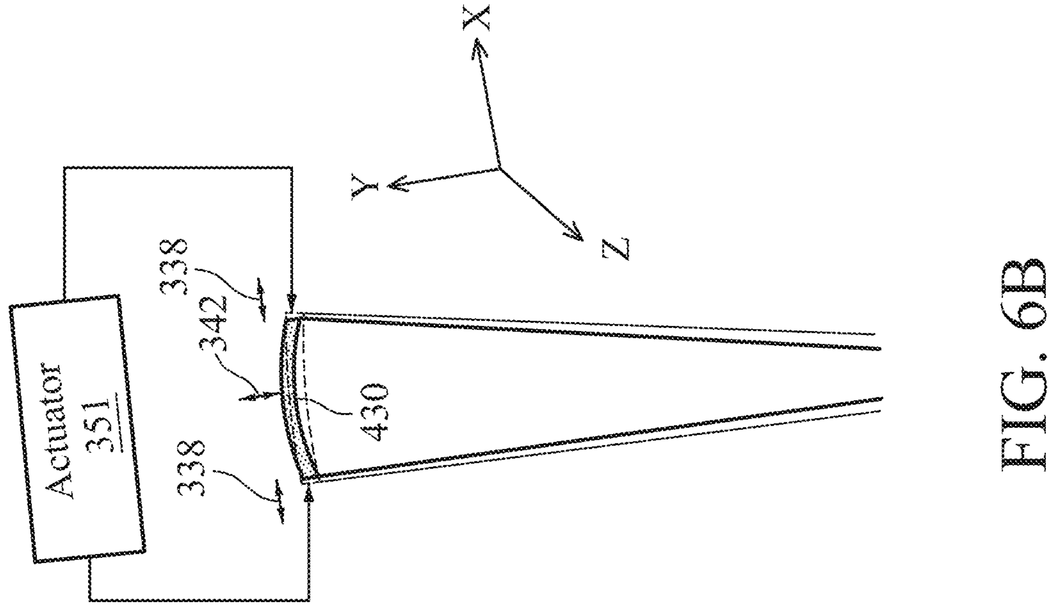
FIGS. 6A and 6B show mirrors and an actuator of the mirrors in accordance with some embodiments of the present disclosure.
Figure 6A:
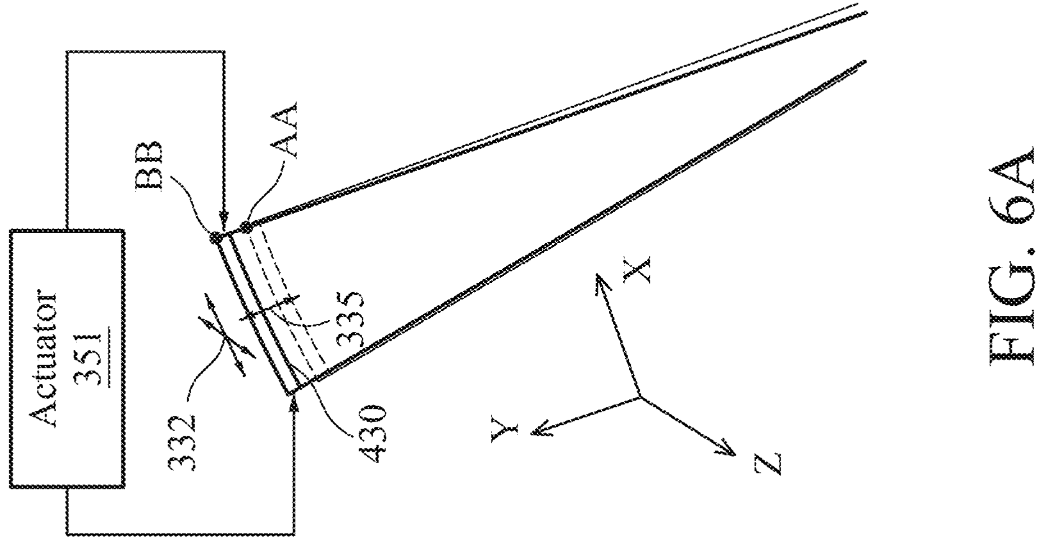

FIGS. 6A and 6B show mirrors and an actuator of the mirrors in accordance with some embodiments of the present disclosure. FIG. 6A shows adjusting the location of the mirror 430 of FIG. 5A, to adjust the projected beam on the projection optics 204 on the wafer 490 and to reduce the aberration on the die 470 and on the slits 472. As shown in FIG. 6A, by moving the mirror 430 along the Y-direction (the direction of light propagation of the EUV radiation beam 29 or 31), it is possible to adjust the phase of the wavefront of the reflected EUV radiation beam 31 to reduce the aberration on the die 470 and on the slits 472. As shown, the actuator 351 moves one or more of the mirror 430 in a direction 335 (Y-direction from a point AA to a point BB which is in the direction of propagation of the EUV radiation beam 31) or in the lateral direction 332, X-direction and/or Z-directions.

In some embodiments, as shown in FIG. 6B, the actuator 351 is configured to exert pressure along a line 338 to change a curvature of the mirror 430 by changing the curvature perpendicular to a line 342, e.g., increasing or reducing the curvature perpendicular to the line 342 to change a focal position/distance of the mirror 430, which in turn adjusts the phase of the wavefront of the reflected EUV radiation beam 31 to reduce the aberration on the die 470 and on the slits 472. In some embodiments, the actuator 351 includes a plurality of pistons or piezoelectric elements to change the curvature of the mirror 430. In some embodiments, the pressure is exerted to at least two locations on a perimeter of the mirror 430 or 400 and the curvature changes perpendicular to the line 342, the focal distance of the mirror 430 is modified. In some embodiments, if the curvature is increased, the focal distance is reduced but if the curvature is reduced the focal distance is increased. In some embodiments, one or more mirrors M1, M2, M3, M4, or M5 that are consistent with the mirrors 430 are tilted with respect to the direction of the reflected EUV radiation beam 31 to adjust the Zernike coefficients and to reduce the aberration on the die 470 and on the slits 472. In some embodiments, by exerting pressure at two or more points on a perimeter of the above mirrors or by exerting pressure at a two or more points at a back surface of the above mirrors a deformation and/or curvature change is produced in the mirrors to generate the phase change in the wavefront reflected from the mirrors to remedy the aberration.

In some embodiments, the controller 460 simultaneously exerts pressure to two or more mirrors M1, M2, M3, M4, or M5 to simultaneously change the curvature of two or more mirrors M1, M2, M3, M4, or M5 or individually exerts pressure to one of mirrors M1, M2, M3, M4, or M5 to change the curvature of one mirror. In some embodiments, the curvature is changed within about ±5% from the original curvature (±5% of the focal length from the original focal length is changed). In some embodiments, a curvature and/or location of the lenses L1 and L2 are controllable. Thus, modifying the curvature and/or location of the lenses L1 and L2 produces the effects of the two or more Zernike plates 352 of FIG. 3D, e.g., may adjust the Zernike coefficients corresponding with the aberration of the objective lens system 306.

In some embodiments, as discussed, the mirror M1, M2, M3, M4, or M5 is either a flat mirror, a convex mirror, or a concave mirror. Thus, by exerting pressure to at least two points on the perimeter of the mirrors, a flat mirror may become either a convex or a concave mirror, a convex mirror may become more or less convex, and a concave mirror may become more or less concave.

Figure 7A:
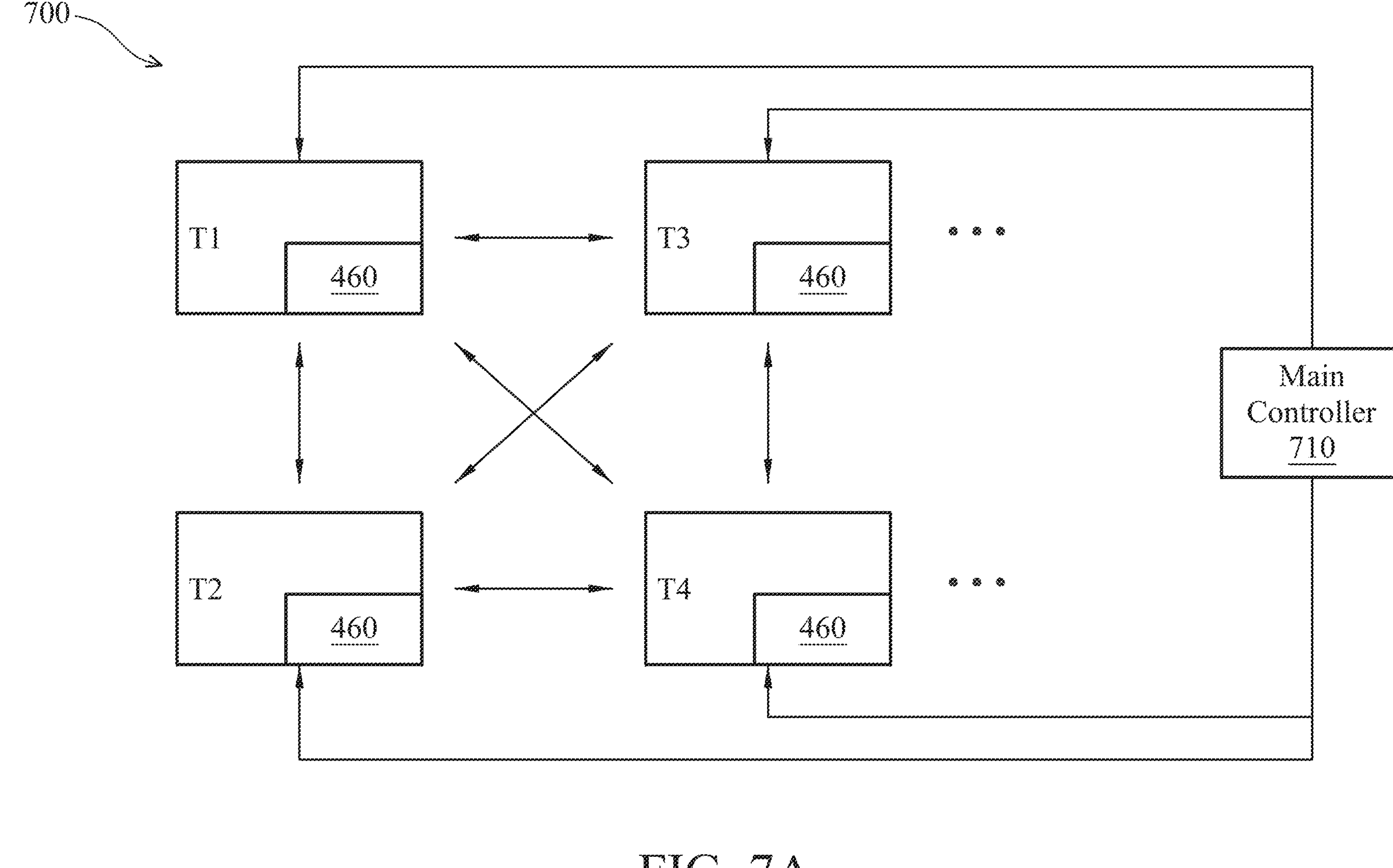
FIGS. 7A and 7B show a system of multiple scanner tools and a system of matching multiple scanner tools in accordance with some embodiments of the present disclosure.
Figure 7B:
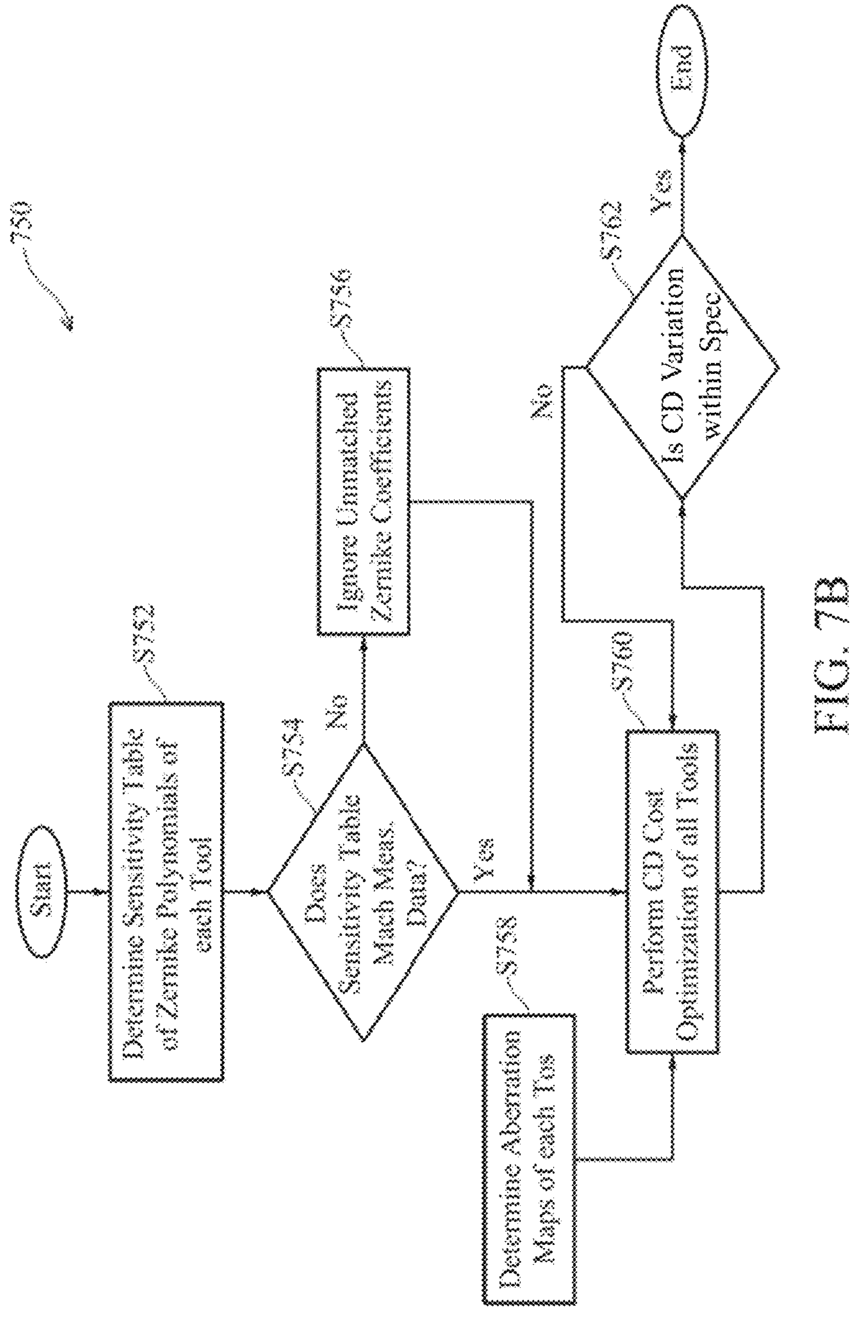

FIGS. 7A and 7B show a system of multiple scanner tools and a system of matching multiple scanner tools in accordance with some embodiments of the present disclosure.

FIG. 7A shows a computer system 700 of multiple scanner tools that are coupled to each other and communicate with each other. As shown, in some embodiments, the scanner tools are all connected to a main controller 710 that controls four or more scanner tools that include scanner tools T1, T2, T3, and T4 each having a separate controller 460. In some embodiments, the main controller 710 commands the scanner tools T1, T2, T3, and T4 to determine the aberration map of the scanner tools, e.g., the aberration map of the optical system of the exposure devices 200 that includes the illumination optics 202 and the projection optics 204. In addition, the main controller 710, commands the scanner tools T1, T2, T3, and T4 to modify, based on the aberration maps of the tools, e.g., the aberration map of a respective tool and aberration maps of other tools, the Zernike coefficients of each tool T1, T2, T3, and T4 to reduce CD variations among the scanner tools T1, T2, T3, and T4. In some embodiments, the main controller 710 does not exist and one of the controllers 460 of the scanner tools T1, T2, T3, and T4 performs the functionality of the main controller 710. In some embodiments, the computer system 700 includes between 5 and 10 scanner tools.

FIG. 7B shows a system for matching the different scanner tools described above. The system shows a process 750 for matching different scanner tools T1, T2, T3, T4, etc. The process 750 starts at the operation S752 where a sensitivity table for Zernike polynomials of each Tool is determined, e.g., measured. In some embodiments, the effect of a change in a Zernike coefficient to a change in a CD value on each tool is determined and a ratio between the CD value change and the Zernike coefficient change is determined for all the Zernike coefficients/polynomials as the sensitivity table of Zernike polynomials of each tool. In some embodiments, the aberration map is determined, e.g., measured, in each slit 472 of the dies of the wafer and, thus, the sensitivity table of the Zernike polynomials of each tool is determined, e.g., measured in every slit of the dies of the wafer. Then the same sensitivity ratios are calculated using simulated measurements.

In operation S754, it is determined if the measured sensitivity values are consistent with the calculated values. Such that, e.g., when Zernike coefficient increases, the CD value change also increases in both measurement and calculations. When the measured sensitivity values are consistent, the Zernike coefficient is kept, e.g., used, during the optimization. However, in operation S756, if Zernike coefficient changes and the CD change in measurement and calculations are not consistent, the corresponding Zernike coefficient and Zernike polynomial is ignored and is not used for optimization. In some embodiments, the corresponding coefficient is set to zero. Now the coefficients with consistent relation between the Zernike coefficients change and the change in CD in both measurement and calculation, is used for estimating the next Zernike coefficient and determining the CD change. In operation S758, the aberration map of each scanner is determined. Measuring the aberration map is described with respect to FIG. 3A, 3B, or 3C. In operation S760, a CD cost is defined and the CD cost is optimized for all scanner tools T1, T2, T3, and T4. The CD cost (defined in equation (2)) may be defined as a sum of exponential functions of CD variations of each slit over all the slits. In some embodiments, the CD variation of a slit is set to zero if the CD variation is within a predetermined threshold value. The CD variations are defined in equation (3). In some embodiments, the predetermined threshold value is between about 0.05 nm and 0.15 nm for an average CD value of 3 nm. In some embodiments, the threshold value is between about one and two percent.

In operation S762, if the CD variations among the scanner tools T1, T2, T3, and T4 is not within the predetermined threshold value, the CD cost is optimized again in operation S760 using the aberration maps until the CD variations is within the predetermined threshold value. Equation (1) below shows the relation between a sensitivity table, the change is Zernike coefficients, and the change is in CD values. As shown, the sensitivity is defined in every slit of each die. As shown, a change is CD value can be calculated based on the sensitivity table and the Zernike coefficient change. As shown, the below equation (1) is defined for one of the slits, e.g., the first slit, and similar relations can be defined for other slits. The first matrix on the left is the sensitivity table, e.g., sensitivity matrix, having m values for each slit of a die of each tool where m is the number of Zernike coefficients that is used during optimization. The second matrix in the middle is the Zernike coefficient changes for the first slit. The result of multiplying these matrices gives change in CD changes in the first slit of different scanner tools. In some embodiments, the equation (1) is used for optimization such that changes of the Zernike coefficients are selected and based on the equation (1) the changes in the CD values are calculated. Then using the equations (2) and (3) below, the cost function is calculated, e.g., recalculated, based on the changes in CD values. Based on the calculated cost function and equation (1), the changes to Zernike coefficients are determined and the equations (1) to (3) are recursively calculated. In some embodiments, a lower limit and/or an upper limit for the Zernike coefficients is determined and the selected changes of the Zernike coefficients in each step of the recursive calculations are kept within the upper and lower limits. In some embodiments, the recursive steps are performed until the cost function gets below or becomes equal to a predetermined cost threshold value and final Zernike coefficients are determined. In some embodiments, the cost threshold value is zero. In some embodiments, the recursive steps are performed until the CD variations are within the predetermined threshold value defined above and final Zernike coefficients are determined. In some embodiments, development of the photoresist pattern on the substrate is included when calculating the sensitivity.

$$\begin{bmatrix} S_{1T1Sl1} & S_{mT1Sl1} \\ S_{1TnSl1} & S_{mTnSl1} \end{bmatrix} \begin{bmatrix} Z_{1Sl1} \\ Z_{mSl1} \end{bmatrix} \Rightarrow \begin{bmatrix} \Delta CD_{T1Sl1} \\ \Delta CD_{TnSl1} \end{bmatrix} \quad \text{equation (1)}$$

$$\ldots \qquad \ddots \qquad \qquad \ldots$$

The cost function is defined below in equation (2). The cost function is a sum of exponentials of the CD variation of the slits as defined in equation (3). In some embodiments, steepest descent is used for minimizing the cost function.

$$J(\vec{Z}) = \sum_{pattern=1}^{k} \sum_{slit=1}^{n} \exp(\Delta CD_{Total}(\text{pattern}(\text{slit})) \quad \text{equation (2)}$$

Where:

$$\Delta CD_{Total}(\text{pattern})(\text{slit}) = \quad \text{equation (3)}$$

-continued $$\begin{cases} \text{Max}(\Delta CD_{Tool\_1}, \ldots, \Delta CD_{Tool\_n}) - \text{Min}(\Delta CD_{Tool\_1}, \ldots, \Delta CD_{Tool\_n}) & : CD_{Total}(\text{slit}) > SPEC \\ 0 & : CD_{Total}(\text{slit}) < SPEC \end{cases}.$$

As defined above, the CD variation in each slit is the difference between maximum CD differences in the slit among the scanner tools minus the minimum CD differences in the slit among the scanner tools and when the CD variation is within the predetermined threshold value, the CD variation is set to zero. As described, recursively using equations (1)-(3) optimizes the cost function and brings the CD variations among the tools under the specified threshold. Also, determines the changes to the Zernike coefficients and determines the final Zernike coefficients. As described above, the scanner tools may use mirrors or lenses with controllable curvature or location to modify the wavefront reflected from the mirror or to modify the wavefront transmitted through the lenses and to modify the Zernike coefficients by controlling the mirrors or the lenses. Thus, incorporating the changes to the Zernike coefficients and implementing the final Zernike coefficients may be performed by moving the mirrors up/down, left/right, or front/back, by tilting one or more mirrors, and/or changing the curvature of one or more mirrors as described above. In some embodiments, after implementing the final Zernike coefficients, the CD variations of the scanner tools are measured to confirm that the CD variations are within the specified threshold value. When the measured CD variations of the scanner tools are not within the specified threshold value, the Zernike coefficients are further adjusted by recursively using equations (1)-(3) with a CD threshold value that is at least 5 percent tighter that the specified threshold value.

In some embodiments, tilting includes rotating the one or more mirrors around an axis of the mirror 430 or 400 that coincides with a diameter of the mirror that is parallel to or having a 45 degrees angle with one of the X-direction or Z-direction. In some embodiments, the one or more mirrors are rotated around an axis parallel to the Y-direction that goes through the center of the mirror.

Figure 8A:
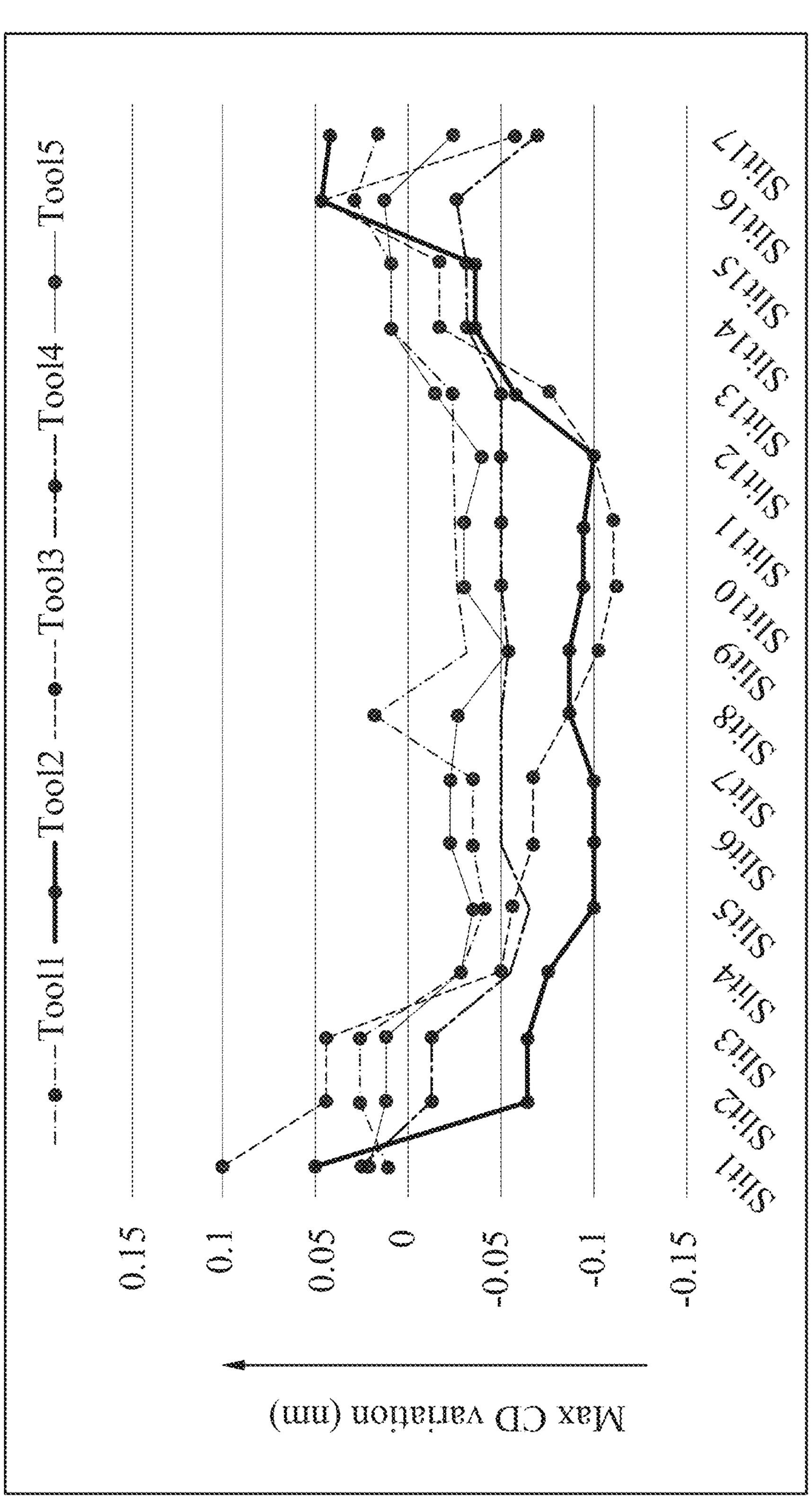
FIGS. 8A and 8B show critical dimension variation of different scanner tool of the system of multiple scanner tools before and after tool matching in accordance with some embodiments of the present disclosure.
Figure 8B:
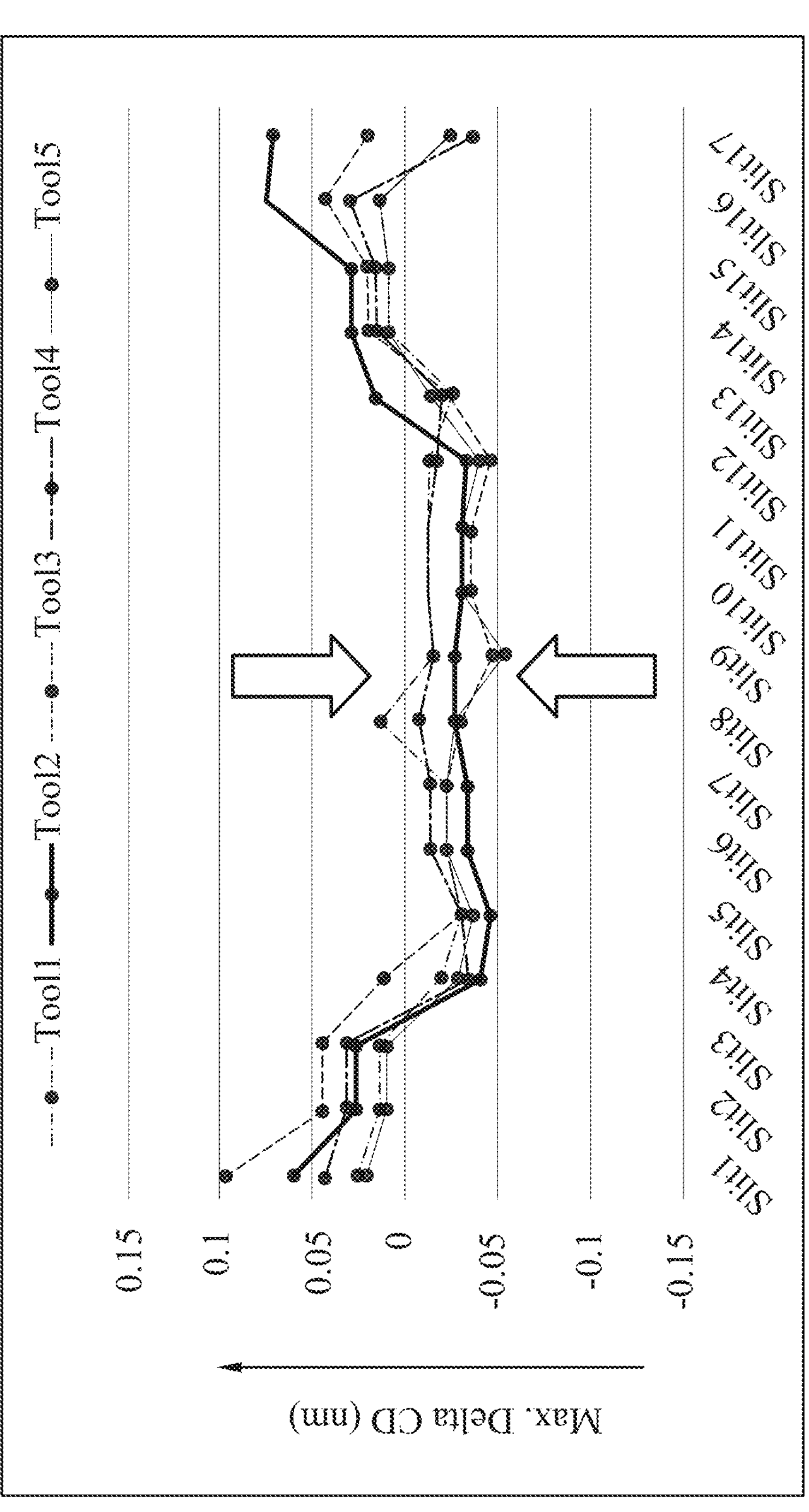

FIGS. 8A and 8B show critical dimension variation of different scanner tool of the system of multiple scanner tools before and after tool matching in accordance with some embodiments of the present disclosure. FIG. 8A shows maximum CD variations of different scanner tool when the same layout pattern is produced on the different scanner tools. As displayed, a die, e.g., the die 470, on the substrate is divided into 17 slits and the CD variations (in nm) are determined separately inside the slits. FIG. 8B shows maximum CD variations (in nm) of different scanner tool when the same layout pattern is produced on the different scanner tools after the tool matching process introduced above is implemented the tools. As shown, after matching the tools the CD variations are drastically reduced, specially in slits around the center of the die. As described, the Zernike coefficients in the different slits are separately adjusted.

Figure 9:
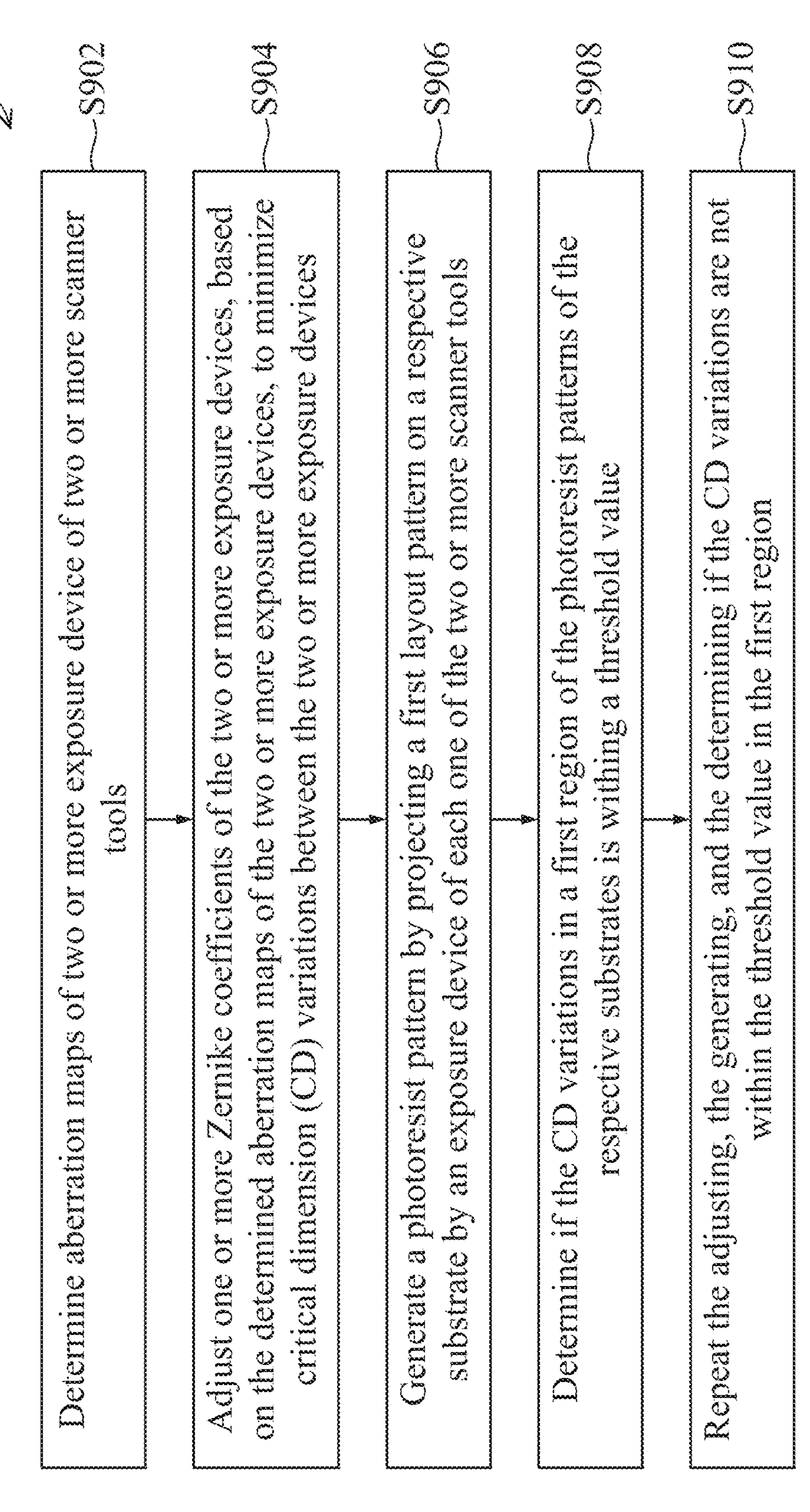
FIG. 9 shows a flow diagram of a process for matching multiple scanner tools in accordance with some embodiments of the present disclosure.

FIG. 9 shows a flow diagram of a process 900 for matching multiple scanner tools in accordance with some embodiments of the present disclosure. The process 900 or a portion of the process 900 may be performed by the exposure device 200 of FIG. 5D. In some embodiments, the process 900 or a portion of the process 900 is performed and/or is controlled by the computer system 700 described below with respect to FIGS. 10A and 10B. In some embodiments, the process 900 or a portion of the process 900 is performed by the system of multiple scanner tools of FIG. 7A and the system of matching multiple scanner tools of FIG. 7B described above.

The process 900 includes an operation S902, where aberration maps of two or more exposure devices of two or more scanner tools are determined. As described, the aberration maps may be determined by the exposure device 200 of FIG. 3A or by the optical systems 300 and 350 of FIGS. 3B and 3C. In operation S904, one or more Zernike coefficients of the two or more exposure devices are adjusted based on the aberration maps of the two or more exposure devices to minimize critical dimension (CD) variations between the two or more exposure devices. As described, the Zernike coefficients are adjusted in FIG. 5D by adjusting the curvature and/or location of one or more the mirrors M1, M2, M3, M4, or M5 of the projection optics 204. In some embodiments, the mirror M6 is not adjusted.

As defined above, adjusting the Zernike coefficients may be performed by moving one or more mirrors up/down, left/right, or front/back, by tilting one or more mirrors, and/or changing the curvature of one or more mirrors as described above with respect to FIGS. 5A, 5B, 6A, and 6B. In some embodiments, the Zernike coefficients Z5 to Z12 of the fifth Zernike polynomial to the $12^{th}$ Zernike polynomial are modified. In some embodiments, the coefficients of Z5 to Z12 are modified by moving one or more mirrors up/down, left/right, or front/back and no tilting is implemented to optimizes the cost function and to bring the CD variations among the tools under the specified threshold.

In operation S906, a photoresist pattern is generated by projecting a first layout pattern on a respective substrate by an exposure device of each one of the two or more scanner tools. As shown in FIG. 2, the photoresist pattern is generated by projecting the layout masks of the reticle 205 on the photoresist coated substrate 210. In operation S908, it is determined if the CD variations in a first region of the photoresist patterns of the respective substrates is within a threshold value. In operation S910, the adjusting, the generating, and the determining are repeated if the CD variations are not within the threshold value in the first region. As shown in FIG. 7B, if the CD variations is not within spec, the step is repeated. In some embodiments, the optimization process as set forth above is performed periodically, for example, a predetermined time period (e.g., once a week) and/or a predetermined process number (e.g., the number of wafers processed).

Figures 10A, 10B:
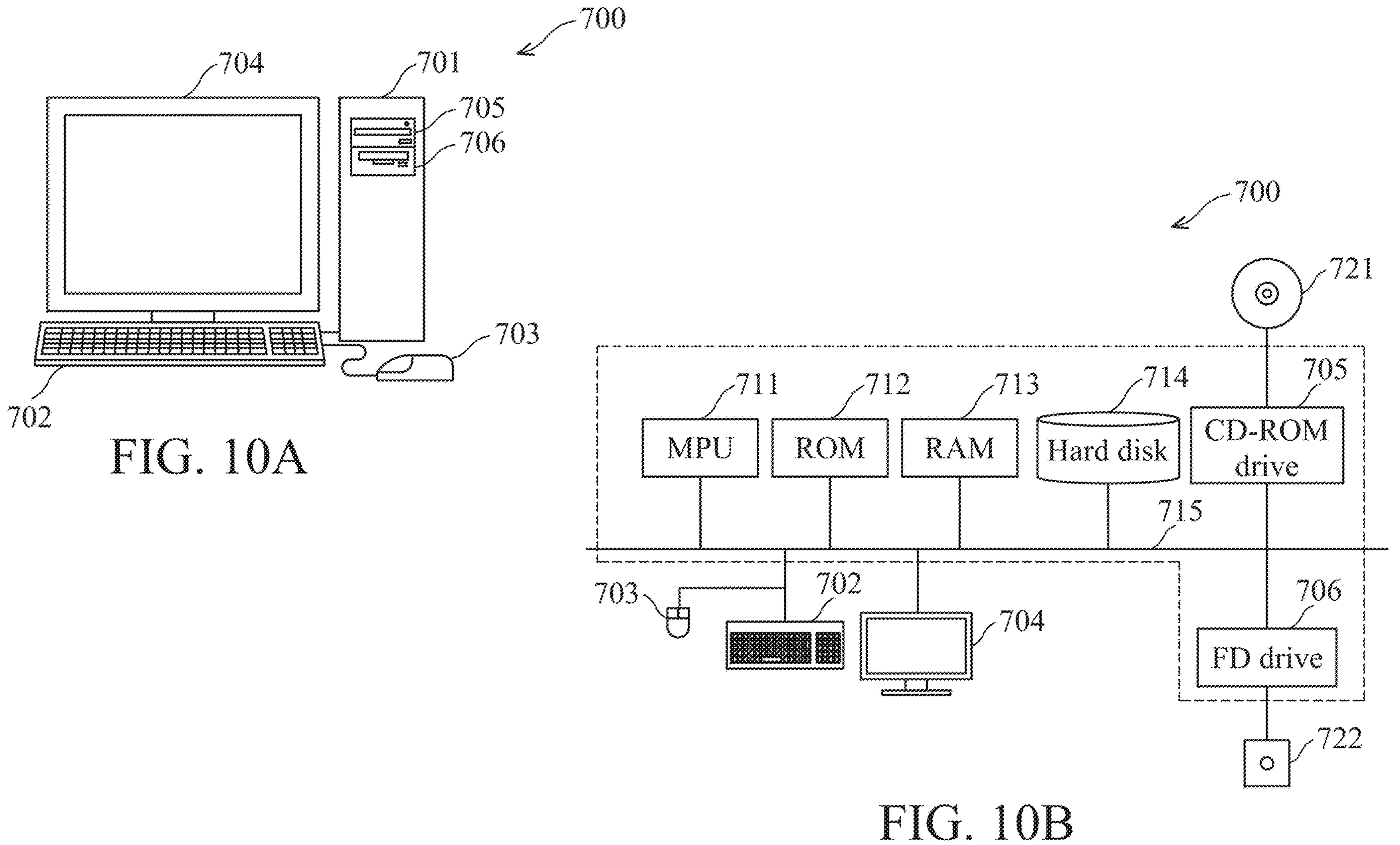
FIGS. 10A and 10B illustrate an apparatus for matching multiple scanner tools in accordance with some embodiments of the present disclosure.

FIGS. 10A and 10B illustrate an apparatus for matching multiple scanner tools in accordance with some embodiments of the present disclosure. In some embodiments, the computer system 700 is used for performing the functions of the analyzer module 230, the controller 460, and the main controller 710 of FIGS. 2, 3A, 3B, 3C, 5A, 5B, 5C, 5D, and 7A. In some embodiments, the computer system controls the actuator 351. In some embodiments, the computer system 700 is used to execute the process 750 or a portion of the process 750 of FIG. 7B or the process 900 of FIG. 9.

FIG. 10A is a schematic view of a computer system that performs the functions of an apparatus for matching multiple scanner tools. All of or a part of the processes, method and/or operations of the foregoing embodiments can be realized using computer hardware and computer programs executed thereon. In FIG. 10A, a computer system 700 is provided with a computer 701 including an optical disk read only memory (e.g., CD-ROM or DVD-ROM) drive 705 and a magnetic disk drive 706, a keyboard 702, a mouse 703, and a monitor 704.

Figures 11A, 11B, 11C, 11D:
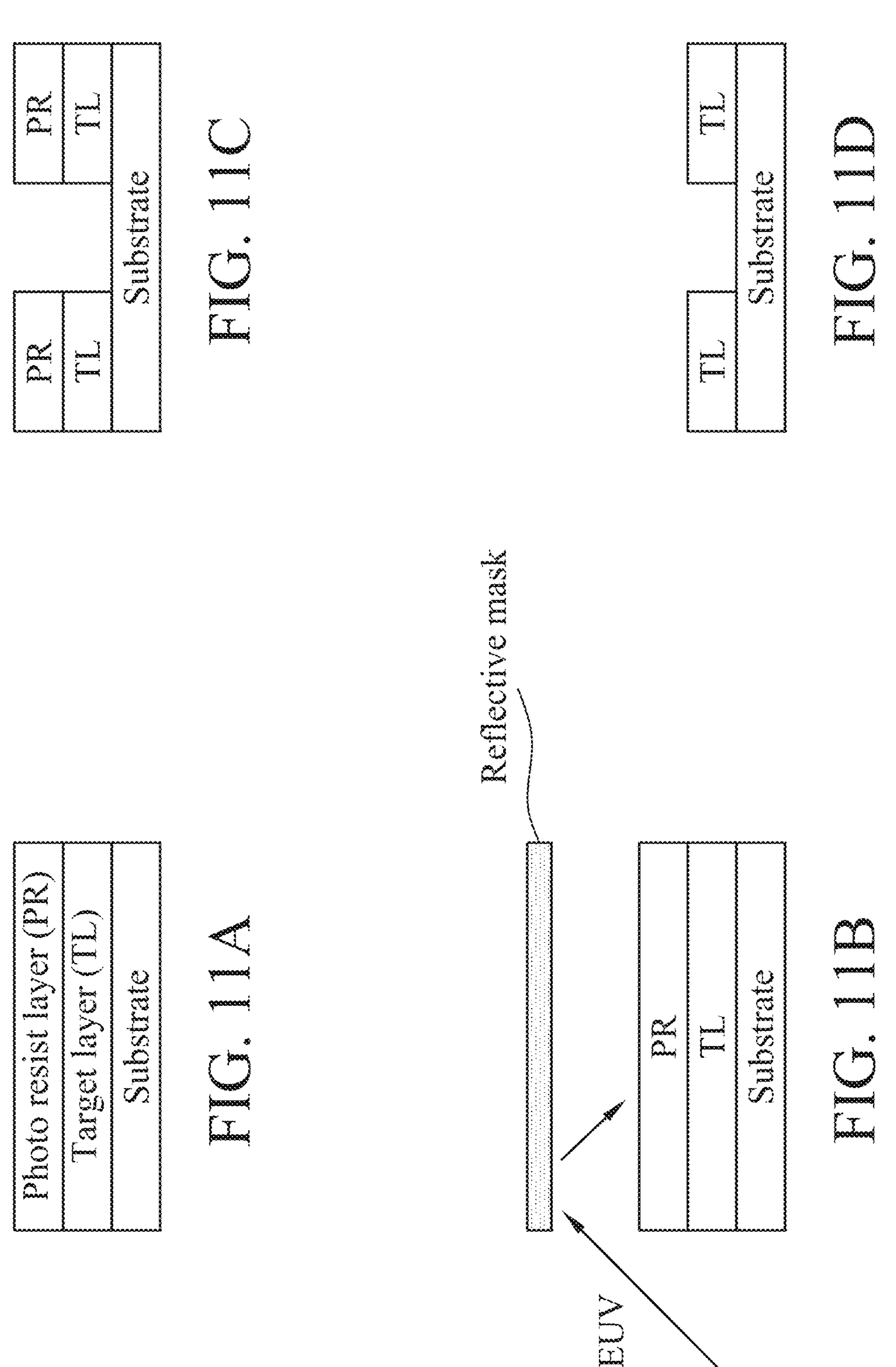
FIGS. 11A, 11B, 11C, and 11D show a sequential manufacturing operation of a method of making a semiconductor device in accordance with embodiments of the present disclosure.

FIG. 10B is a diagram showing an internal configuration of the computer system 700. In FIG. 11B, the computer 701 is provided with, in addition to the optical disk drive 705 and the magnetic disk drive 706, one or more processors, such as a micro processing unit (MPU) 711, a ROM 712 in which a program such as a boot up program is stored, a random access memory (RAM) 713 that is connected to the MPU 711 and in which a command of an application program is temporarily stored and a temporary storage area is provided, a hard disk 714 in which an application program, a system program, and data are stored, and a bus 715 that connects the MPU 711, the ROM 712, and the like. Note that the computer 701 may include a network card (not shown) for providing connection to a LAN.

The program for causing the computer system 700 to execute the functions for matching multiple scanner tools in the foregoing embodiments may be stored in an optical disk 721 or a magnetic disk 722, which are inserted into the optical disk drive 705 or the magnetic disk drive 706, and transmitted to the hard disk 714. Alternatively, the program may be transmitted via a network (not shown) to the computer 701 and stored in the hard disk 714. At the time of execution, the program is loaded into the RAM 713. The program may be loaded from the optical disk 721 or the magnetic disk 722, or directly from a network. The program does not necessarily have to include, for example, an operating system (OS) or a third party program to cause the computer 701 to execute the functions of the controller 460 or the main controller 710 for matching multiple scanner tools in the foregoing embodiments. The program may only include a command portion to call an appropriate function (module) in a controlled mode and obtain desired results.

FIGS. 11A, 11B, 11C, and 11D show a sequential manufacturing operation of a method of making a semiconductor device in accordance with embodiments of present disclosure. In some embodiments, one or more scanner tools that are matched with the system and methods described above, are used for making the semiconductor device described in FIGS. 11A, 11B, 11C, and 11D. As shown in FIG. 11A, a photo resist layer PR is formed over a target layer TL that is disposed on a substrate. The photo resist layer PR is sensitive to the radiation from the exposing source during a subsequent photolithography exposing process. In the present embodiment, the photo resist layer is sensitive to EUV light used in the photolithography exposing process. The photo resist layer PR may be formed over the target layer TL by spin-on coating or other suitable techniques. The coated photo resist layer may be further baked to drive out solvent in the photo resist layer. As shown in FIG. 11B, the photoresist layer PR is patterned using an EUV reflective mask as set forth above. The patterning of the photoresist layer includes performing a photolithography exposing process by an EUV exposing system using the EUV mask, e.g., the reticle 205. During the exposing process, the integrated circuit (IC) design pattern defined on the EUV mask is imaged to the photoresist layer to form a latent pattern thereon as shown in FIG. 2. The patterning of the photoresist layer further includes developing the exposed photoresist layer PR to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

As shown in FIG. 11C, the target layer TL is patterned utilizing the patterned photoresist layer as an etching mask. In some embodiments, patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 11D.

According to some embodiments of the present disclosure, a method of scanner tool matching includes determining aberration maps of two or more optical systems of two or more scanner tools and adjusting one or more Zernike coefficients of the two or more optical systems, based on the determined aberration maps of the two or more optical systems, to minimize critical dimension (CD) variations between the two or more scanner tools. The method also includes generating a photoresist pattern by projecting a first layout pattern on a respective substrate by an optical system of each one of the two or more scanner tools and determining if the CD variations in a first region of the photoresist patterns of the respective substrates is within a threshold value. The method further includes repeating the adjusting, the generating, and the determining if the CD variations are not within the threshold value in the first region. In an embodiment, the two or more scanner tools includes a first scanner tool, a second scanner tool, a third scanner tool, and a fourth scanner tool, and the method further includes minimizing the CD variations in the first region of the photoresist patterns between respective substrates of the first, second, third, and fourth scanner tools. In an embodiment, minimizing the CD variations includes maintaining the CD variations below the threshold value of one percent. In an embodiment, the first region is a die having a length or width between 4 mm and 5 mm. In an embodiment, an extreme ultraviolet (EUV) radiation beam is used by the two or more optical systems of the two or more scanner tools for projecting the first layout pattern on the respective substrates. Each one of the two or more optical systems includes a first mirror, and the method further includes moving the first mirror to adjust the one or more Zernike coefficients. In an embodiment, in the at least one optical system, first mirror is either moved in a direction of EUV radiation beam transmission, or in a lateral direction relative to the direction of EUV radiation beam transmission. In an embodiment, an extreme ultraviolet (EUV) radiation beam is used in the two or more optical systems of the two or more scanner tools for projecting the first layout pattern on the respective substrates. Each one of the two or more optical systems includes a first mirror, and the method further includes modifying a curvature of the first mirror to adjust the one or more Zernike coefficients.

According to some embodiments of the present disclosure, a method of scanner tool matching includes determining aberration maps of two or more optical systems of two or more scanner tools and adjusting two or more Zernike coefficients of the two or more optical systems, based on the determined aberration maps of the two or more optical systems, to minimize critical dimension (CD) variations between the two or more scanner tools. The method also includes first generating a first photoresist pattern by projecting a first layout pattern on a respective substrate by an optical system of each one of the two or more scanner tools and second generating a second photoresist pattern by projecting a second layout pattern on the respective substrate by the optical system of each one of the two or more scanner tools. The method further includes determining if the CD variations in a first region of the first photoresist patterns and in a second region of the second photoresist patterns of the respective substrates is within a threshold value. The method includes repeating the adjusting, the first generating, the second generating, and the determining if the CD variations are not within the threshold value in the first region and in the second region. In an embodiment, the two or more scanner tools include a first scanner tool, a second scanner tool, a third scanner tool, a fourth scanner tool, and a fifth scanner tool, the method further includes minimizing the CD variations in the first region of the first photoresist patterns and in the second region of the second photoresist patterns between respective substrates of the first, second, third, fourth, and fifth scanner tools. In an embodiment, an average CD value in the first and second regions is 3 nm, and minimizing the CD variations includes maintaining the CD variations below the threshold value of 0.1 nm in the first and second regions. In an embodiment, an extreme ultraviolet (EUV) radiation beam is used in the two or more optical systems of the two or more scanner tools for projecting the first and second layout patterns on the respective substrates. Each one of the two or more optical systems includes first and second mirrors, and the method further includes moving at least the first mirror and moving at least the second mirror to adjust the two or more Zernike coefficients. At least the first mirror and at least the second mirror are either moved in a direction of EUV radiation beam transmission, or in a lateral direction relative to the direction of EUV radiation beam transmission. In an embodiment, an extreme ultraviolet (EUV) radiation beam is used in the two or more optical systems of the two or more scanner tools for projecting the first and second layout patterns on the respective substrates. Each one of the two or more optical systems includes first and second mirrors, and adjusting the two or more Zernike coefficients is performed by exerting pressure on two or more points on a perimeter of at least the first mirror to modify a curvature of at least the first mirror and exerting pressure on two or more points on a perimeter of at least the second mirror to modify a curvature of at least the second mirror. In an embodiment, the method further includes determining a maximum value of CD variations in each of the first and the second regions of the respective substrates of the two or more scanner tools, determining a minimum value of CD variations in each of the first and the second regions of the respective substrates of the two or more scanner tools, determining a difference between the maximum value of CD variations and the minimum value of the CD variations in each of the first and the second regions, defining a cost function as a sum of exponential functions of the differences in the first and second regions, and determining the two or more Zernike coefficients by iteratively minimizing the cost function. In an embodiment, the method further includes determining a sensitivity map of each of the two or more optical systems of the two or more scanner tools. The sensitivity map includes CD variations based on Zernike coefficient variations, and iteratively minimize the cost function using the sensitivity map of the two or more optical systems of the two or more scanner tools.

According to some embodiments of the present disclosure, a system for matching scanner tools includes two or more scanner tools, each scanner tool includes an optical system, and each optical system includes two or more mirrors. The optical systems also include a controller, an image detector, an analyzer module, and an actuator coupled to the two or more mirrors. In each one of the two or more optical systems, the analyzer module receive an aberration map of a respective optical system from the image detector and to send the aberration map of the respective optical system to the controller. In each one of the two or more optical systems, the controller is received aberration maps of other optical systems. The controller also adjusts one or more Zernike coefficients of the respective optical system and adjusts one or more Zernike coefficients of the other optical systems, based on the aberration maps of the respective optical system and the other optical systems, to minimize critical dimension (CD) variations when the two or more scanner tools are used for photo lithography using an extreme ultraviolet (EUV) radiation beam to project a layout pattern onto a substrate. In an embodiment, the actuator moves at least one mirror of the two or more mirrors to adjust the one or more Zernike coefficients. In an embodiment, the at least one mirror is either moved in a direction of EUV radiation beam transmission or in a lateral direction relative to the direction of EUV radiation beam transmission. In an embodiment, the actuator is coupled to a perimeter of at least one mirror and is to exert pressure on two or more points on the perimeter of the mirror to modify a curvature of the mirror to adjust one or more Zernike coefficients. In an embodiment, movement of the two or more mirrors includes a positional move in one or more of up/down, right/left, or front/back directions. In an embodiment, movement of the two or more mirrors comprise rotating the two or more mirrors around an axis of the mirror that coincides with a diameter of the mirror.

As described, Zernike coefficients of multiple scanner tools are adjusted based on the aberration maps of the scanner tools to match the CD of the multiple tools without using a golden scanner tool. Mirrors are moved to modify the beam width of an EUV radiation beam on a reticle to limit the beam width to the extent of the layout patterns of the reticle and avoid using reticle-masks to limit the extra coverage of the EUV radiation beam on a reticle. Thus, increase the throughput and efficiency of the exposure system.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:

two or more scanner tools, wherein each scanner tool comprises an optical system, wherein each optical system comprises:

two or more mirrors;

a controller;

an image detector;

an analyzer module; and an actuator coupled to the two or more mirrors;

wherein in each optical system, the analyzer module is configured to receive an aberration map of a respective optical system from the image detector and to send the aberration map of the respective optical system to the controller, and wherein in each optical system, the controller is configured to receive aberration maps of other optical systems, and wherein the controller is also configured to adjust one or more Zernike coefficients of the respective optical system and to adjust one or more Zernike coefficients of the other optical systems, based on the aberration maps of the respective optical system and the other optical systems, to minimize critical dimension (CD) variations when the two or more scanner tools are used for photo lithography using an extreme ultraviolet (EUV) radiation beam to project a layout pattern onto a substrate.

2. The system of claim 1, wherein the actuator is configured to move at least one mirror of the two or more mirrors to adjust the one or more Zernike coefficients.

3. The system of claim 2, wherein the at least one mirror is either moved:

in a direction of EUV radiation beam transmission, or in a lateral direction relative to the direction of EUV radiation beam transmission.

4. The system of claim 1, wherein the actuator is coupled to a perimeter of at least one mirror and is configured to exert pressure on two or more points on a perimeter of the at least one mirror to modify a curvature of the at least one mirror to adjust one or more Zernike coefficients.

5. The system of claim 4, wherein movement of the two or more mirrors comprises a positional move in one or more of up/down, right/left, or front/back directions.

6. The system of claim 1, wherein movement of the two or more mirrors comprises rotating the two or more mirrors around an axis of the two or more mirrors that coincides with a diameter of the two or more mirrors.

7. The system of claim 1, wherein the two or more scanner tools comprise a first scanner tool, a second scanner tool, a third scanner tool, and a fourth scanner tool, and the controller is also configured to minimize the CD variations in a region of a photoresist pattern corresponding to the layout pattern between respective substrates of the first, second, third, and fourth scanner tools.

8. A system, comprising:

two or more scanner tools, wherein each scanner tool comprises an optical system, wherein each optical system comprises:

a controller;

an image detector; and an analyzer module;

wherein in each optical system, the analyzer module is configured to receive an aberration map of a respective optical system from the image detector and to send the aberration map of the respective optical system to the controller, and wherein in each optical system, the controller is configured to receive aberration maps of other optical systems, and wherein the controller is also configured to adjust one or more Zernike coefficients of the respective optical system and to adjust one or more Zernike coefficients of the other optical systems, based on the aberration maps of the respective optical system and the other optical systems, to minimize critical dimension (CD) variations when the two or more scanner tools are used for photo lithography using an extreme ultraviolet (EUV) radiation beam to project a layout pattern onto a substrate.

9. The system of claim 8, wherein each optical system comprises:

two or more mirrors; and an actuator coupled to the two or more mirrors, wherein at least one mirror is configured to move in a direction of EUV radiation beam transmission.

10. The system of claim 8, wherein each optical system comprises:

two or more mirrors; and an actuator coupled to the two or more mirrors, wherein at least one mirror is configured to move in a lateral direction relative to a direction of EUV radiation beam transmission.

11. The system of claim 10, wherein the actuator is coupled to a perimeter of the at least one mirror and is configured to exert pressure on two or more points on a perimeter of the at least one mirror to modify a curvature of the at least one mirror to adjust one or more Zernike coefficients.

12. The system of claim 10, wherein movement of the two or more mirrors comprises a positional move in one or more of up/down, right/left, or front/back directions.

13. The system of claim 10, wherein movement of the two or more mirrors comprises rotating the two or more mirrors around an axis of the two or more mirrors that coincides with a diameter of the two or more mirrors.

14. The system of claim 8, wherein the two or more scanner tools comprise a first scanner tool, a second scanner tool, a third scanner tool, and a fourth scanner tool, and the controller is also configured to minimize the CD variations in a region of a photoresist pattern corresponding to the layout pattern between respective substrates of the first, second, third, and fourth scanner tools.

15. A system, comprising:

two or more scanner tools, wherein each scanner tool comprises an optical system, wherein each optical system comprises:

two or more mirrors;

a controller;

an image detector; and an actuator coupled to the two or more mirrors; and wherein in each optical system, the controller is configured to receive aberration maps of a respective optical system and other optical systems, and wherein the controller is also configured to adjust one or more Zernike coefficients of the respective optical system and to adjust one or more Zernike coefficients of the other optical systems, based on the aberration maps of the respective optical system and the other optical systems, to minimize critical dimension (CD) variations.

16. The system of claim 15, wherein the actuator is configured to move at least one mirror of the two or more mirrors to adjust the one or more Zernike coefficients.

17. The system of claim 16, wherein the at least one mirror is either moved:

in a direction of extreme ultraviolet (EUV) radiation beam transmission of an EUV radiation beam used by the two or more scanner tools, or in a lateral direction relative to the direction of the EUV radiation beam transmission.

18. The system of claim 15, wherein the actuator is coupled to a perimeter of at least one mirror and is configured to exert pressure on two or more points on a perimeter of the at least one mirror to modify a curvature of the at least one mirror to adjust one or more Zernike coefficients.

19. The system of claim 18, wherein movement of the two or more mirrors comprises a positional move in one or more of up/down, right/left, or front/back directions.

20. The system of claim 15, wherein the controller is further configured to:

generate a photoresist pattern by projecting a first layout pattern on a respective substrate by an optical system of each one of the two or more scanner tools;

determine if the CD variations in a first region of the photoresist pattern of the respective substrate are within a threshold value; and repeat the adjusting, the generating, and the determining if the CD variations are not within the threshold value in the first region.

* * * * *